United States Patent
Wu et al.

(10) Patent No.: US 11,450,555 B2
(45) Date of Patent: Sep. 20, 2022

(54) METHOD FOR FORMING SEMICONDUCTOR DEVICE HAVING ISOLATION STRUCTURES WITH DIFFERENT THICKNESSES

(71) Applicant: TAIWAN SEMICONDUCTOR MANUFACTURING CO., LTD., Hsinchu (TW)

(72) Inventors: Cheng-Ta Wu, Chiayi County (TW); Chii-Ming Wu, Taipei (TW); Sen-Hong Syue, Hsinchu County (TW); Cheng-Po Chau, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/200,198

(22) Filed: Mar. 12, 2021

(65) Prior Publication Data
US 2021/0202301 A1    Jul. 1, 2021

Related U.S. Application Data

(63) Continuation of application No. 16/222,769, filed on Dec. 17, 2018, now Pat. No. 10,950,490, which is a (Continued)

(51) Int. Cl.
*H01L 21/762* (2006.01)
*H01L 21/8234* (2006.01)
(Continued)

(52) U.S. Cl.
CPC .. *H01L 21/76229* (2013.01); *H01L 21/76232* (2013.01); *H01L 21/823412* (2013.01);
(Continued)

(58) Field of Classification Search
CPC ......... H01L 21/76229; H01L 21/76232; H01L 21/823412; H01L 21/823431;
(Continued)

(56) References Cited

U.S. PATENT DOCUMENTS 8,878,309 B1    11/2014  Hong et al.
9,368,496 B1 *   6/2016  Yu ...................... H01L 29/7855
(Continued)

FOREIGN PATENT DOCUMENTS

CN    103378153 A    10/2013
CN    104425493 A     3/2015
CN    104517845 A     4/2015

*Primary Examiner* — Shahed Ahmed
(74) *Attorney, Agent, or Firm* — Maschoff Brennan

(57) ABSTRACT

A method includes forming a first trench in a semiconductor substrate. A mask is filled in the first trench and over the semiconductor substrate. After filling the mask in the first trench, the mask is patterned to form an opening in the mask. A second trench is formed in the semiconductor substrate. A depth of the second trench is different from a depth of the first trench. After forming the second trench in the semiconductor substrate, the mask is removed. A dielectric material is filled in both the first and second trenches.

20 Claims, 28 Drawing Sheets

Related U.S. Application Data continuation of application No. 15/660,107, filed on Jul. 26, 2017, now Pat. No. 10,157,770.

(60) Provisional application No. 62/427,056, filed on Nov. 28, 2016.

(51) Int. Cl.
  *H01L 27/088* (2006.01)
  *H01L 29/06* (2006.01)
  *H01L 29/78* (2006.01)
  H01L 27/105 (2006.01)
  H01L 27/146 (2006.01)

(52) U.S. Cl.
  CPC ........ *H01L 21/823431* (2013.01); *H01L 21/823481* (2013.01); *H01L 27/0886* (2013.01); *H01L 29/0653* (2013.01); *H01L 29/785* (2013.01); *H01L 27/105* (2013.01); *H01L 27/1463* (2013.01)

(58) Field of Classification Search
  CPC ......... H01L 21/823481; H01L 27/0886; H01L 29/0653; H01L 27/105; H01L 27/1463; H01L 21/823878; H01L 27/0924; H01L 21/76224–76237; H01L 29/66795–66818; H01L 29/785–7856; H01L 29/04–045
  See application file for complete search history.

(56) References Cited

U.S. PATENT DOCUMENTS

| | | |
|---|---|---|
| 9,391,074 B1 * | 7/2016 | Leobandung ....... H01L 27/0886 |
| 9,793,174 B1 | 10/2017 | Huang et al. |
| 9,805,982 B1 | 10/2017 | Zang et al. |
| 2011/0303982 A1 | 12/2011 | Chung et al. |
| 2013/0049138 A1 | 2/2013 | Zhu et al. |
| 2013/0181299 A1 | 7/2013 | Baldauf et al. |
| 2013/0270620 A1 | 10/2013 | Hu et al. |
| 2014/0077303 A1 | 3/2014 | Baek |
| 2015/0187766 A1 | 7/2015 | Basker et al. |
| 2016/0190122 A1 * | 6/2016 | Hu ................. H01L 21/823412 257/296 |
| 2016/0315084 A1 * | 10/2016 | Wu ..................... H01L 29/1033 |
| 2016/0315147 A1 | 10/2016 | Leobandung et al. |
| 2017/0345840 A1 | 11/2017 | Su et al. |
| 2017/0358562 A1 | 12/2017 | Banna et al. |

\* cited by examiner

METHOD FOR FORMING SEMICONDUCTOR DEVICE HAVING ISOLATION STRUCTURES WITH DIFFERENT THICKNESSES

PRIORITY CLAIM AND CROSS-REFERENCE

This is a continuation application of the U.S. application Ser. No. 16/222,769, filed Dec. 17, 2018, now U.S. Pat. No. 10,950,490, issued Mar. 16, 2021, which is a continuation application of the U.S. application Ser. No. 15/660,107, filed Jul. 26, 2017, now U.S. Pat. No. 10,157,770, issued Dec. 18, 2018, which claims priority to U.S. Provisional Application Ser. No. 62/427,056, filed Nov. 28, 2016, which is herein incorporated by reference.

BACKGROUND

Shallow trench isolation (STI) helps to prevent electrical current leakage between adjacent semiconductor devices. In STI, one or more trenches, i.e., the trenches, are etched into a surface of a substrate and then filled with a dielectric material. The trenches are used to isolate semiconductor devices. The dielectric material helps to reduce electrical current leakage between the semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
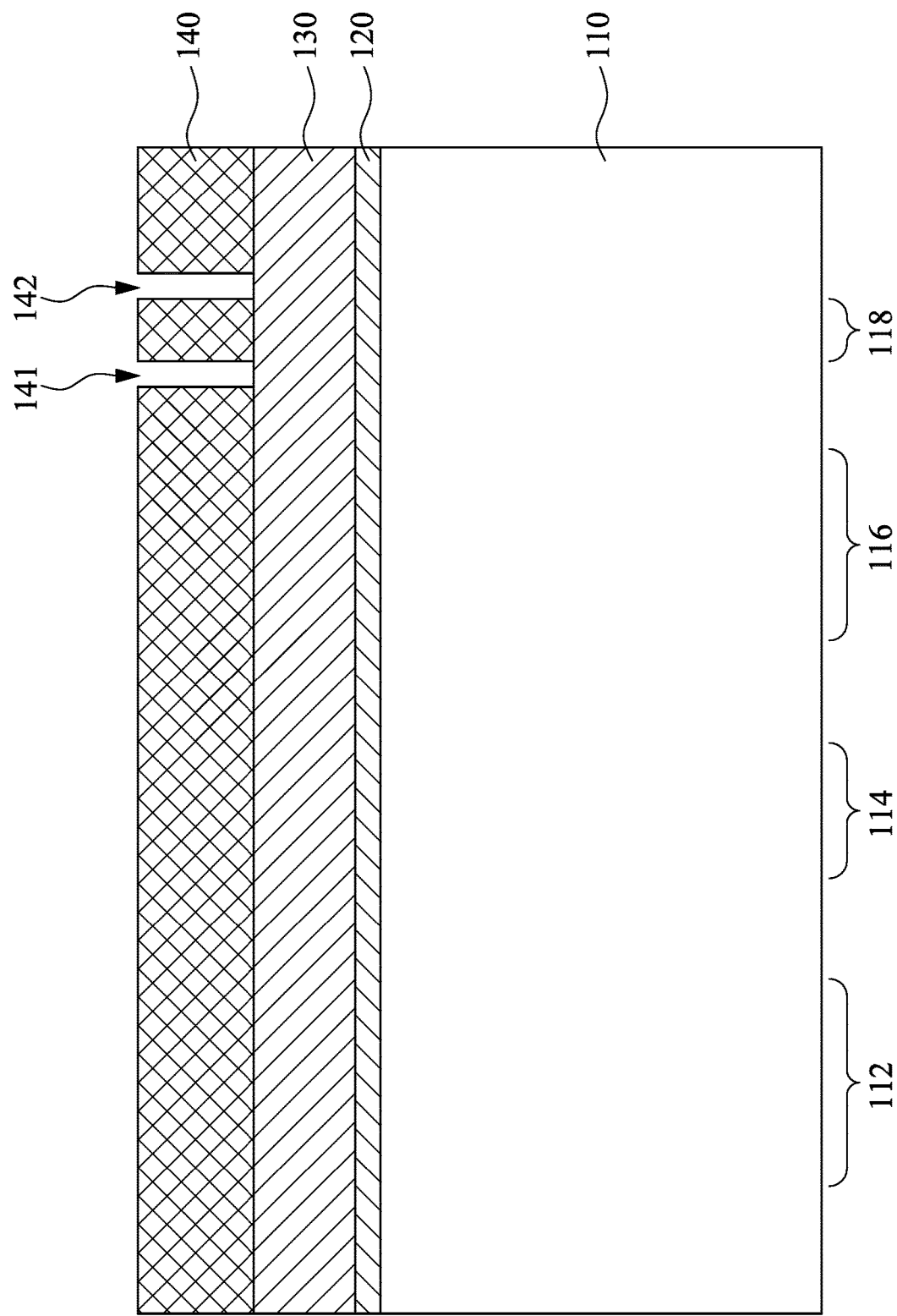
FIGS. 1-14 are cross-sectional views of a method for manufacturing an integrated circuit at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-14 are cross-sectional views of a method for manufacturing an integrated circuit at various stages in accordance with some embodiments of the present disclosure. As shown in FIG. 1, semiconductor substrate 110 includes portions in device regions 112, 114, 116 and 118. In some embodiments, the semiconductor substrate 110 includes silicon. Other materials, such as carbon, germanium, gallium, arsenic, nitrogen, indium, phosphorus, or the like, may also be included in semiconductor substrate 110. In some embodiments, device regions 112, 114, 116 and 118 are different regions exemplarily including a logic core region, a high voltage (HV) device region, a memory device region (such as an embedded non-volatile memory (NVM) region or an embedded static random access memory (SRAM) region), a complementary metal-oxide-semiconductor (CMOS) image sensor region, an analog region, an input/output region, a dummy region (for forming dummy patterns), or the like. The above-referenced device regions are schematically illustrated in FIG. 15. In some exemplary embodiments, the device region 112 is a logic core region, the device region 114 is a HV device region, the device region 116 is a memory device region, and the device region 118 is a CMOS image sensor region.

Pad layer 120 and mask layer 130 are formed on semiconductor substrate 110. The pad layer 120 is blanket formed on the semiconductor substrate 110, and it may be a thin film comprising silicon oxide formed, for example, using a thermal oxidation process, a deposition process, such as chemical vapor deposition (CVD), physical vapor deposition (PVD), or other suitable processes. The mask layer 130 is blanket formed on the pad layer 120. The pad layer 120 acts as an adhesion layer between semiconductor substrate 110 and mask layer 130. The pad layer 120 may also act as an etch stop layer for etching mask layer 130. In some embodiments, the mask layer 130 is formed of silicon nitride, for example, using low-pressure chemical vapor deposition (LPCVD). In other embodiments, the mask layer 130 is formed by thermal nitridation of silicon, plasma enhanced chemical vapor deposition (PECVD), or plasma anodic nitridation. The mask layer 130 is used as a hard mask during subsequent photolithography processes. For example, the mask layer 130 may be used to protect the substrate 110 from fabrication operations involved in the etching of trenches in the substrate 110 and subsequent chemical mechanical polishing (CMP) planarization operations.

Mask 140 is formed over the mask layer 130. The mask 140 may be a photoresist, and it can be patterned with openings, such as openings 141 and 142, in the mask 140 corresponding to locations of trenches to be created. For example, a layer of photoresist material is deposited over the semiconductor substrate 110. The layer of photoresist material is irradiated (exposed) in accordance with a predetermined pattern and developed to remove portions of the photoresist material, so as to form the openings 141 and 142. The remaining photoresist material protects the underlying material from subsequent processing step performed in FIG. 2, such as etching.

Figure 2:
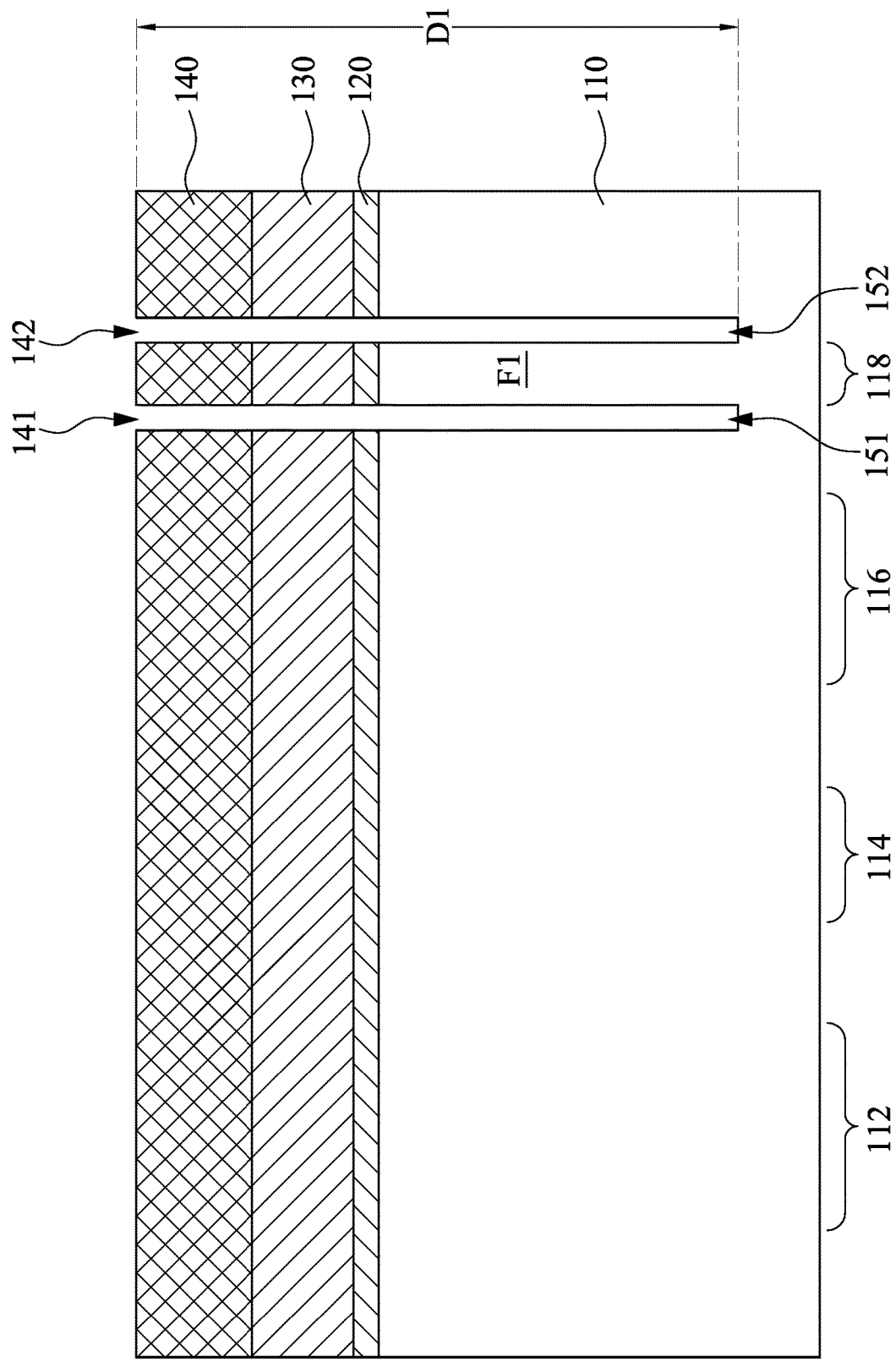

Reference is made to FIG. 2. Portions of the semiconductor substrate 110 underlying the openings 141 and 142 are removed or recessed to form first trenches 151 and 152, and semiconductor fin F1 is also formed between the first trenches 151 and 152. That is, the first trenches 151 and 152 are etched into the semiconductor substrate 110, and a portion of semiconductor substrate 110 between first trenches 151 and 152 thus becomes the semiconductor fin F1 protruding from a portion of the semiconductor substrate 110 underlying the first trenches 151 and 152. The semiconductor fin F1 may be used to form one or more semiconductor devices, such as CMOS image sensors, on the device region 118. The etching of the first trenches 151 and 152 may be performed using any of a variety of substrate etching techniques, such as plasma etching at a variety of pressures, temperatures, and so forth. The etching technique may also etch through the mask layer 130 and the pad layer 120. Since the first trenches 151 and 152 are etched using the same etching process and at the same time, the first trenches 151 and 152 can have substantially the same depth, i.e., a first depth D1.

Figure 3:
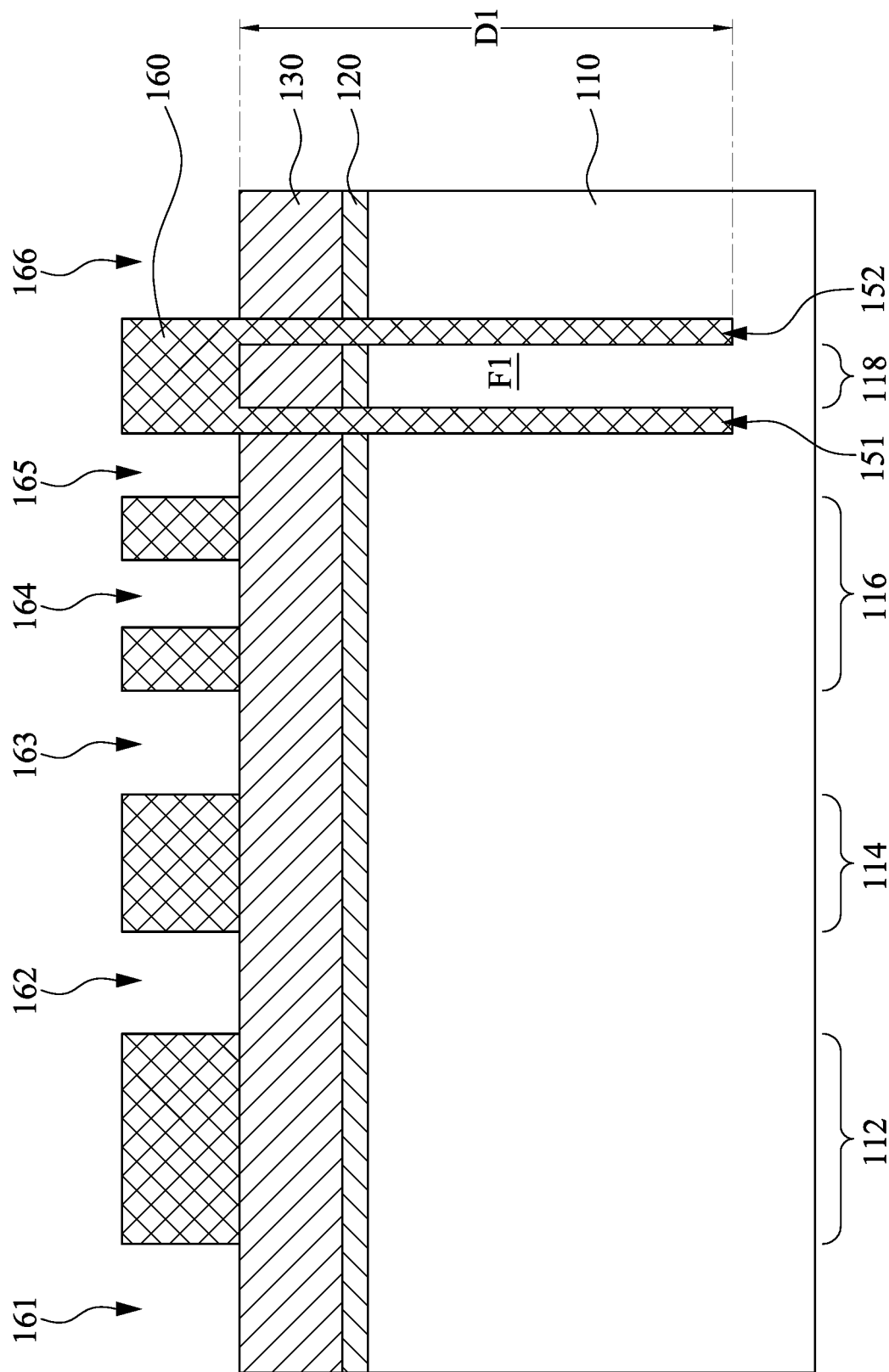

Reference is made to FIG. 3. The mask 140 in FIG. 2 is removed, for example, using an ashing process. Next, mask 160 is applied to the substrate 110 to protect the trenches 151 and 152 already created on the substrate 110. The mask 160 may be a photoresist. This photoresist is applied to an entirety of the substrate 110 and then patterned so that portions of the mask 160 over parts of the substrate 110 with first trenches 151 and 152 remain. A pattern is also applied to the mask 160, wherein the pattern is for use in creating trenches of second depths different from the first depths D1 of the first trenches 151 and 152. The pattern includes openings 161, 162, 163, 164, 165 and 166 in the mask 160. For example, the photoresist may be patterned by exposure and development as discussed previously to form the openings 161-166, wherein none of the openings 161-166 overlie the first trenches 151 and 152. The remaining photoresist material protects the underlying material from subsequent processing step performed in FIG. 4, such as etching.

Figure 4:
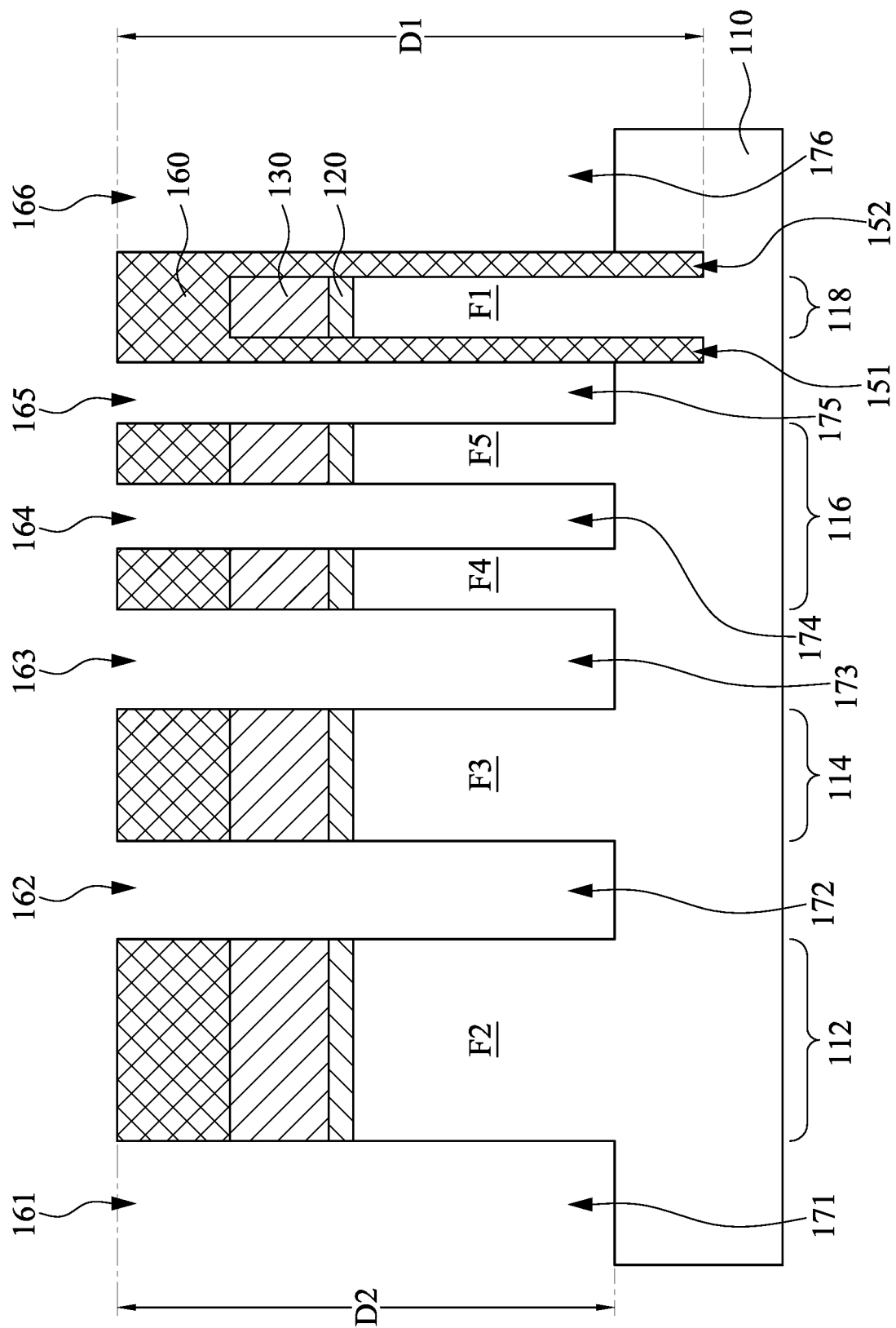

Reference is made to FIG. 4. With the pattern of the mask 160 including the openings 161-166 is created, second trenches 171, 172, 173, 174, 175 and 176 corresponding to the openings 161-166 are etched into the substrate 110. In other words, portions of the semiconductor substrate 110 are removed or recessed to form the second trenches 171-176, and semiconductor fins F2, F3, F4, F5 are formed as well. For example, the second trenches 171 and 172 are etched into the semiconductor substrate 110, and a portion of the semiconductor substrate 110 between the second trenches 171 and 172 thus becomes the semiconductor fin F2 protruding from a portion of the semiconductor substrate 110 underlying the second trenches 171 and 172. The second trenches 173-176 and the semiconductor fins F3-F5 can be formed in a similar manner. The semiconductor fin F2 may be used to form one or more semiconductor devices, such as logic devices, on the device region 112. The semiconductor fin F3 may be used to form one or more semiconductor devices, such as HV devices, on the device region 114. The semiconductor fins F4 and F5 may be used to form one or more semiconductor devices, such as memory devices, on the device region 116. The etching of the second trenches 171-176 may be performed using any of a variety of substrate etching techniques, such as plasma etching at a variety of pressures, temperatures, and so forth. The etching technique may also etch through the mask layer 130 and the pad layer 120. Since the second trenches 171-176 are etched using the same etching process and at the same time, the second trenches 171-176 can have substantially the same depth, i.e. a second depth D2.

As shown in FIG. 4, the second depths D2 of the second trenches 171-176 are different from the first depths D1 of the first trenches 151 and 152. For example, as illustrated, the first depths D1 of the first trenches 151 and 152 are greater than the second depths D2 of the second trenches 171-176. In other words, the first trenches 151 and 152 are deeper than the second trenches 171-176. A difference between the first depth D1 and the second depth D2 may range from about 100 nm and about 3000 nm. The second trenches 171-176 have bottoms located at a height different from a height of the bottoms of the first trenches 151 and 152. For example, the bottoms of the first trenches 151 and 152 are located at a height lower than a height of the bottoms of the second trenches 171-176. The depth difference between the first trenches 151-152 and the second trenches 171-176 can be formed using different etching parameters to etch the first trenches 151-152 and the second trenches 171-176. That is, the etching parameters for etching the first trenches 151 and 152 are different from that for etching the second trenches 171-176, so as to create a predetermined depth difference. The second trenches 175 and 176 expose opposite sidewalls of the mask 160 protecting the first trenches 151 and 152, and therefore, the second trenches 175 and 176 may be adjacent to the first trenches 151 and 152, respectively. Stated differently, the second trench 175 and the first trench 151 deeper than the second trench 175 are communicated after the mask 160 is removed. Similarly, the second trench 176 and the first trench 152 deeper than the second trench 176 are communicated after the mask 160 is removed as well.

Figure 5:
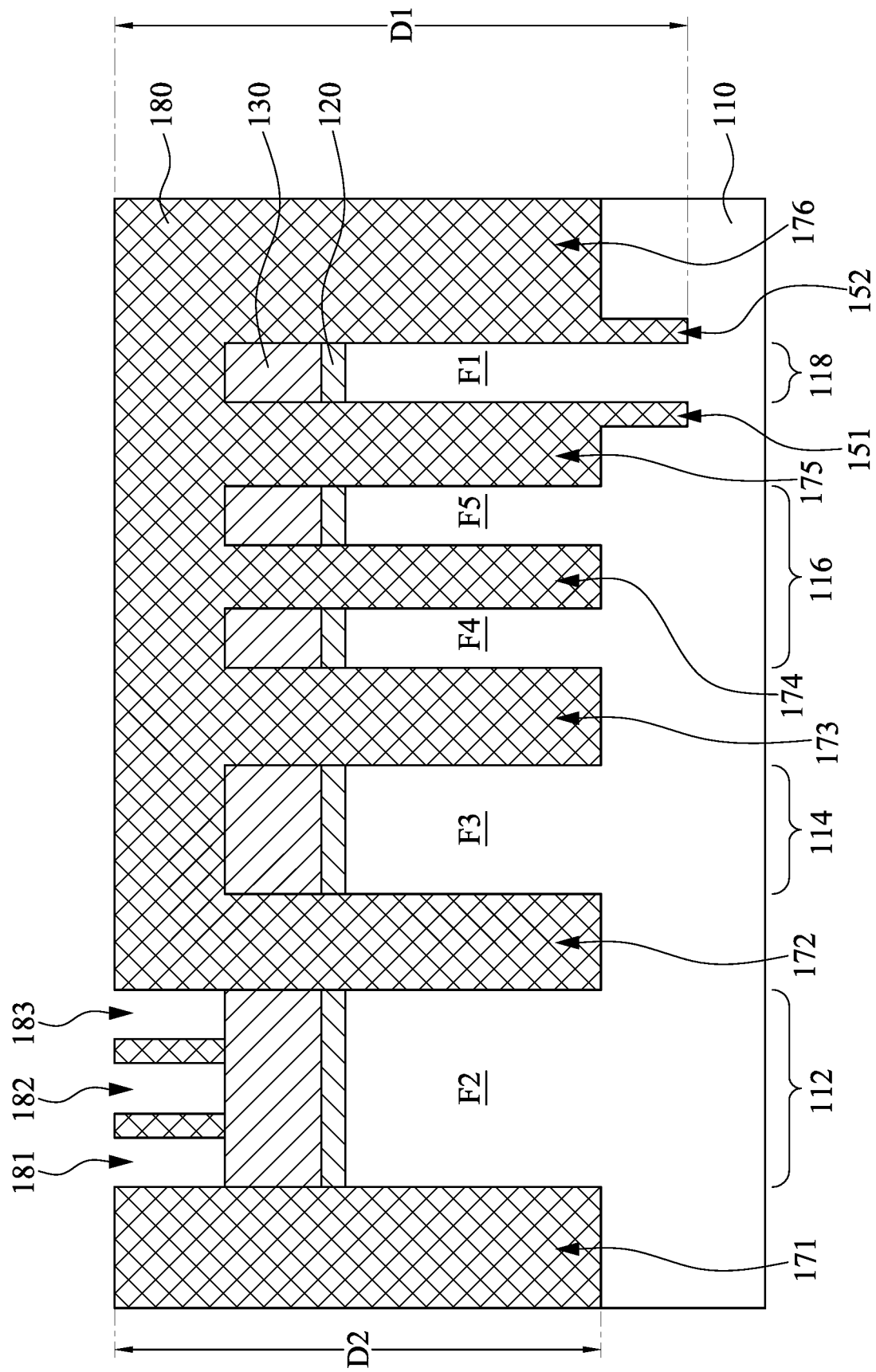

Reference is made to FIG. 5. The mask 160 in FIG. 4 is removed, for example, using an ashing process. Next, a mask 180 is applied to the substrate 110 to protect the first trenches 151-152 and second 171-176 already created on the substrate 110. The mask 180 may be a photoresist. This photoresist is applied to an entirety of the substrate 110 and then patterned so that portions of the mask 180 over parts of the substrate 110 with first trenches 151-152 and second 171-176 remain. A pattern is also applied to the mask 180, wherein the pattern is for use in creating trenches of third depths different from the first depths D1 of the first trenches 151 and 152 and the second depths D2 of the second trenches 171-176. The pattern includes openings 181, 182 and 183 in the mask 180. For example, the photoresist can be patterned by exposure and development as discussed previously to form the openings 181-183, wherein none of the openings 181-183 overlie the first trenches 151, 152 and second trenches 171-176. The remaining photoresist material protects the underlying material from subsequent processing step performed in FIG. 6, such as etching.

Figure 6:
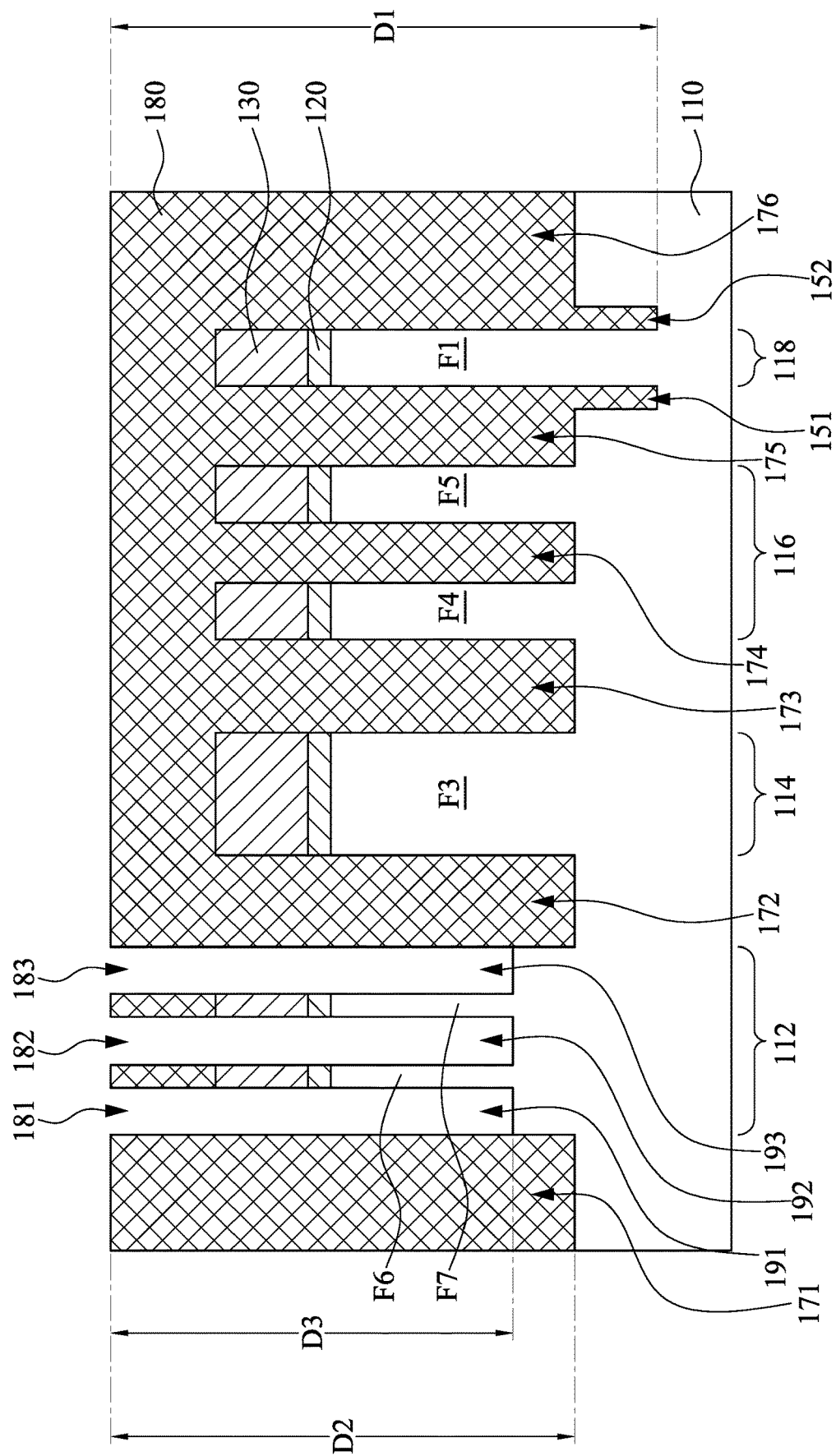

Reference is made to FIG. 6. With the pattern of the mask 180 including openings 181-183 is created, third trenches 191, 192 and 193 corresponding to the openings 181-183 may be etched into the substrate 110. In other words, portions of the semiconductor substrate 110 are removed or recessed to form the third trenches 191-193, and semiconductor fins F6 and F7 are formed as well. For example, the third trenches 191, 192 and 193 are etched into the semiconductor substrate 110, a portion of the semiconductor substrate 110 between the third trenches 191 and 192 thus becomes the semiconductor fin F6 protruding from a portion of the semiconductor substrate 110 underlying the third trenches 191 and 192, and another portion of the semiconductor substrate 110 between the third trenches 192 and 193 thus becomes the semiconductor fin F7 protruding from a portion of the semiconductor substrate 110 underlying the third trenches 192 and 193. The semiconductor fins F6 and F7 may be used to form semiconductor devices, such as logic devices, on the device region 112. The etching of the third trenches 191-193 may be performed using any of a variety of substrate etching techniques, such as plasma etching at a variety of pressures, temperatures, and so forth. The etching technique may also etch through the mask layer 130 and the pad layer 120. Since the third trenches 191-193 are etched using the same etching process and at the same time, the third trenches 191-193 can have substantially the same depth, i.e. a third depth D3.

As shown in FIG. 6, the third depths D3 of the third trenches 191-193 are different from the first depths D1 of the first trenches 151 and 152 and the second depths D2 of the second trenches 171-176. For example, as illustrated, the second depths D2 of the second trenches 171-176 are greater than the third depths D3 of the third trenches 191-193. The first, second and third depths D1, D2 and D3 may satisfy: D1>D2>D3. In other words, the second trenches 171-176 are deeper than the third trenches 191-193. A difference between the second depth D2 and the third depth D3 may range from about 5 nm to about 120 nm. The depth difference between the second trenches 171-176 and the third trenches 191-193 can be formed using different etching parameters to etch the second trenches 171-176 and the third trenches 191-193. That is, the etching parameters for etching the second trenches 171-176 are different from that for etching the third trenches 191-193, so as to create a predetermined depth difference. The third trench 193 exposes a sidewall of the mask 180 protecting the second trench 172, and therefore, the third trench 193 may be adjacent to the second trench 172. Stated differently, the third trench 193 and the second trench 172 are communicated after the mask 180 is removed. After the third trenches 191-193 are created, the mask 180 is removed, for example, using an ashing process. If additional trenches are to be created in the substrate 110, additional patterns may be created and additional etching operations may be repeated to create the additional trenches.

Figure 7:
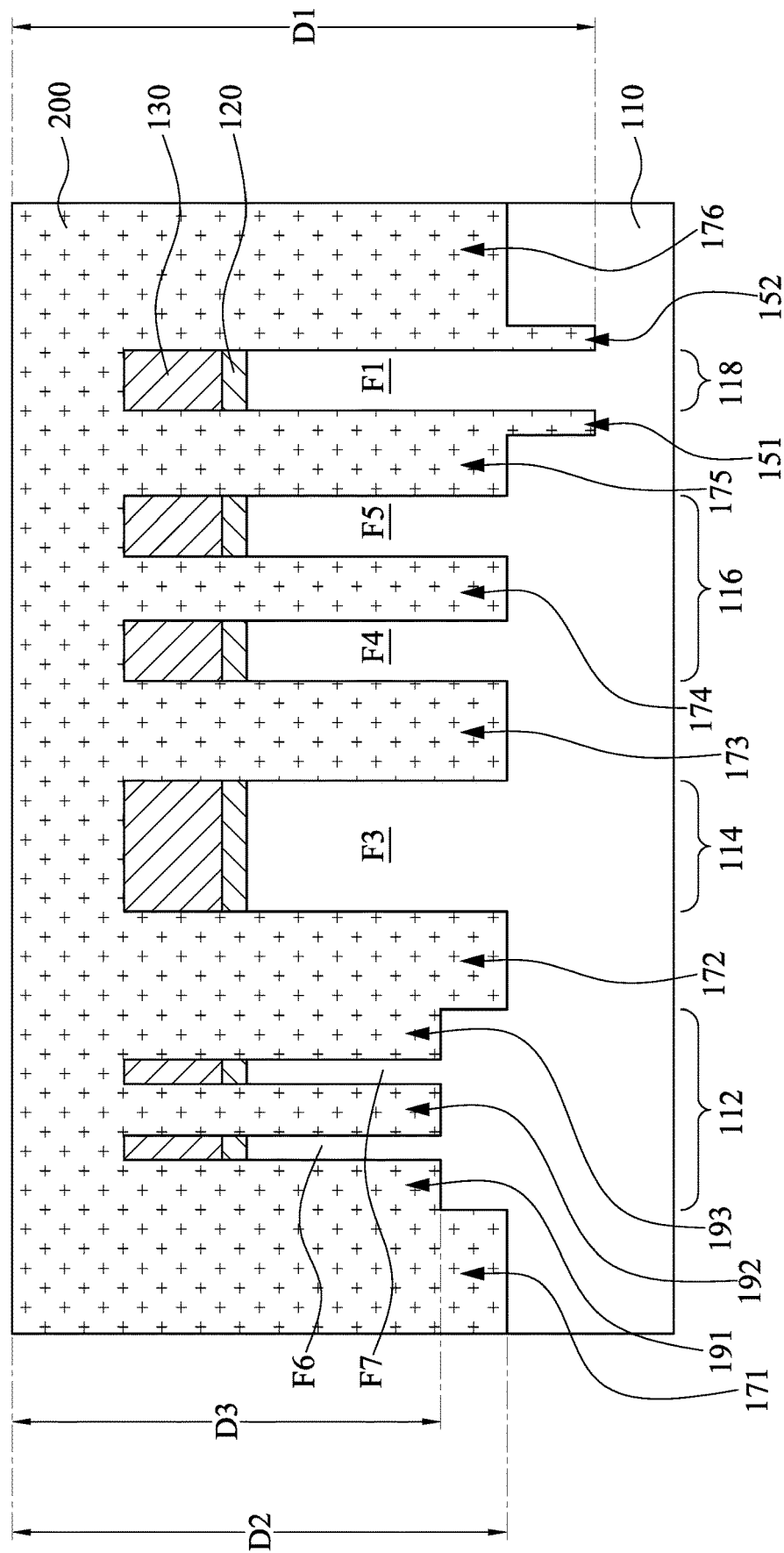

Reference is made to FIG. 7. Dielectric feature 200 is then formed on the substrate 110 to cover the semiconductor fins F1 and F3-F7 and to fill the trenches 151, 152, 171-176 and 191-193. The dielectric feature 200 includes a material such as silicon oxide, silicon nitride, silicon oxynitride, low-k materials, other suitable materials, or any combinations thereof. In some embodiments that the dielectric feature 200 includes silicon oxide, the silicon oxide can be formed by CVD, atomic layer deposition (ALD), high density plasma CVD (HDPCVD), other suitable methods, or combinations thereof. The silicon oxide may be alternatively formed by a high aspect ratio process (HARP). In some embodiments, an optional thermal oxide trench liner is grown to improve the trench interface. The CVD process for depositing the dielectric feature 200, for example, can use chemicals including Hexachlorodisilane (HCD or $Si_2Cl_6$), Dichlorosilane (DCS or $SiH_2Cl_2$), Bis(TertiaryButylAmino)Silane (BTBAS or $C_8H_{22}N_2Si$) and Disilane (DS or $Si_2H_6$). In some embodiments, the dielectric feature 200 can have a multi-layer structure, for example, a thermal oxide liner layer with silicon nitride formed over the liner. Thereafter, a thermal annealing will be performed to the dielectric feature 200.

Figure 8:
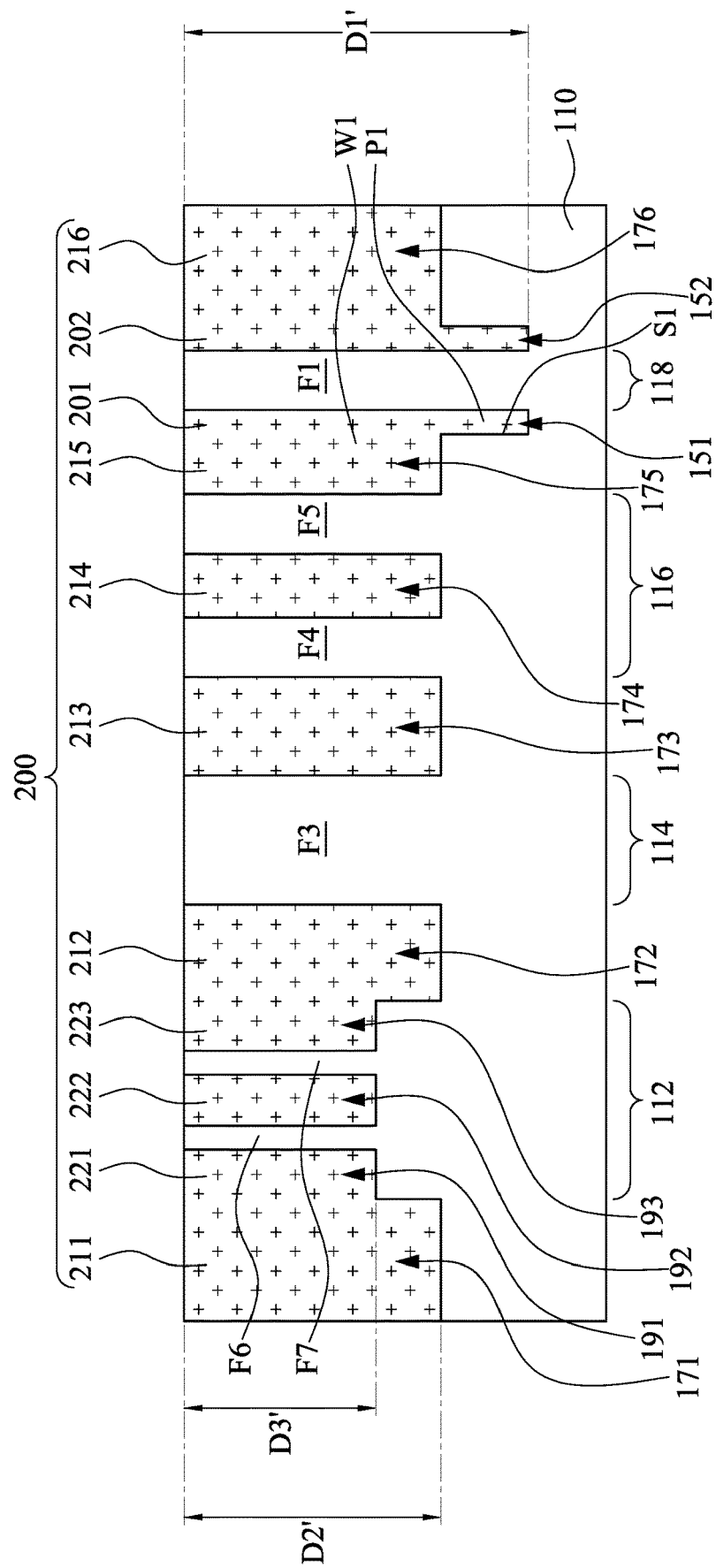

Next, as shown in FIG. 8, planarization process, such as CMP process is performed to remove excess dielectric feature 200 outside the trenches 151, 152, 171-176 and 191-193. The planarization process may also remove the pad layer 120 and the mask layer 130 such that the semiconductor fins F1 and F3-F7 are exposed. After the planarization, portions of the dielectric feature 200 filling the first trenches 151 and 152 can be referred to first shallow trench isolations (STIs) 201 and 202, portions of the dielectric feature 200 filling the second trenches 171-176 can be referred to as second STIs 211-216, and portions of the dielectric feature 200 filling the third trenches 191-193 can be referred to as third STIs 221-223. These STIs can be referred to as isolation structures in some embodiments.

The planarization process may reduce the first, second and third depths D1, D2 and D3 to first, second and third depth D1', D2' and D3', respectively. That is, after the planarization process, the first trenches 151 and 152 have reduced first depth D1', the second trenches 171-176 have reduced second depth D2', and the third trenches 191-193 have reduced third depth D3'. The first STIs 201 and 202 filling the first trenches 151 and 152 may have substantially the same thickness, which is substantially equal to the first depth D1'. The second STIs 211-216 filling the second trenches 171-176 may have substantially the same thickness, which is substantially equal to the second depth D2'. The third STIs 221-223 filling the third trenches 191-193 may have substantially the same thickness, which is substantially equal to the third depth D3'. Since the planarization process form a substantial planar surface for the structure shown in FIG. 8, the reduced first, second and third depth D1', D2' and D3' may satisfy: D1'>D2'>D3', which is similar to D1>D2>D3 as discussed above. Therefore, thicknesses of the first STIs 201 and 202 are greater than thicknesses of the second STIs 211-216, and thicknesses of the second STIs 211-216 are greater than thicknesses of the third STIs 221-223 at this stage. Such thickness differences may be advantageous to provide various isolations suitable for different device regions 112-118 that have different functions. For example, semiconductor devices subsequently formed on the device regions 112-118 for providing different functions may have different device characteristics, such as device dimensions, driving currents, threshold voltages, device densities, and so forth. STIs having different thicknesses are thus advantageous to provide suitable isolations for the device regions 112-118. Stated differently, different STI thicknesses may allow for optimization of the junction isolation for different semiconductor devices in an integrated circuit.

In some embodiments, the first STI 201 and second STI 215 respectively filling the first trench 151 and the second trench 175 that are communicated with each other, and hence the first STI 201 abuts the second STI 215, and the first STI 201 is thicker than the second STI 215. Stated differently, the first STI 201 and second STI 215 thinner than the first STI 201 are monolithically connected, immediately adjacent, or in contact with each other, and materials other than the STIs 201 and 215 are absent between the STIs 201 and 215. For example, a semiconductor feature, a conductive feature or a combination thereof is absent between the STIs 201 and 215. For example, in some embodiments, the first STI 201 has a sidewall 51, and the second STI 215 thinner than the first STI 201 abuts an upper region of the sidewall 51. Stated differently, the first STI 201 has a portion protruded from a bottom surface of the second STI 215. This arrangement may be advantageous to reduce the distance between semiconductor devices on the adjacent device regions 116 and 118 using different STI thicknesses. For example, the device regions 116 and 118 respectively have semiconductor fins F5 and F1 thereon, and the semiconductor fins F5 and F1 are adjacent, which means that an additional semiconductor fin is absent between the semiconductor fins F5 and F1. The STI isolating the semiconductor fins F5 and F1 may include the first STI 201 abutting the semiconductor fin F1 and the second STI 215 abutting the semiconductor fin F5, and the first and second STIs 201 and 215 are abutted as well.

In some embodiments, the first STIs 201 and 202 respectively have bottom surfaces at a height different from a height of the bottom surfaces of the second STIs 211-216, and the bottom surfaces of the second STIs 211-216 are located at a height different from heights of the bottom surfaces of the third STIs 221-223. For example, the bottom surface of the first STI 201 is located at the height lower than the height of its neighboring second STI 215, or stated differently, the bottom surface of the first STI 201 is in a position lower than the bottom surface of the second STI 215. This bottom height difference may be beneficial to make the first STI 201 thicker than the second STI 215. Stated differently, the STI isolating the adjacent semiconductor fins F1 and F5 may include an STI W1 and a dielectric protrusion P1. The dielectric protrusion P1 protrudes from a bottom of the STI W1, and the dielectric protrusion P1 has a width less than the width of the STI W1. The dielectric protrusion P1 protrudes from the STI W1 toward the substrate 110. The dielectric protrusion P1 is closer to the semiconductor fin F1 than to the semiconductor fin F5. For example, the dielectric protrusion P1 abuts the semiconductor fin F1 and is spaced apart from the semiconductor fin F5. Stated differently, the isolation structure isolating the adjacent semiconductor fins F1 and F5 includes a first portion (i.e. STI 201) and a second portion (i.e. STI 215). The first portion is closer to the semiconductor fin F1 than the second portion, and the first portion is thicker than the second portion. For example, the isolation structure isolating two neighboring fins has a stepped bottom surface. Using this configuration, a portion of the STI adjacent to the semiconductor fin F1 has a thickness different from that adjacent to the semiconductor fin F5. This thickness difference may be advantageous to provide suitable isolations for the adjacent semiconductor fins F1 and F5.

Figure 9:
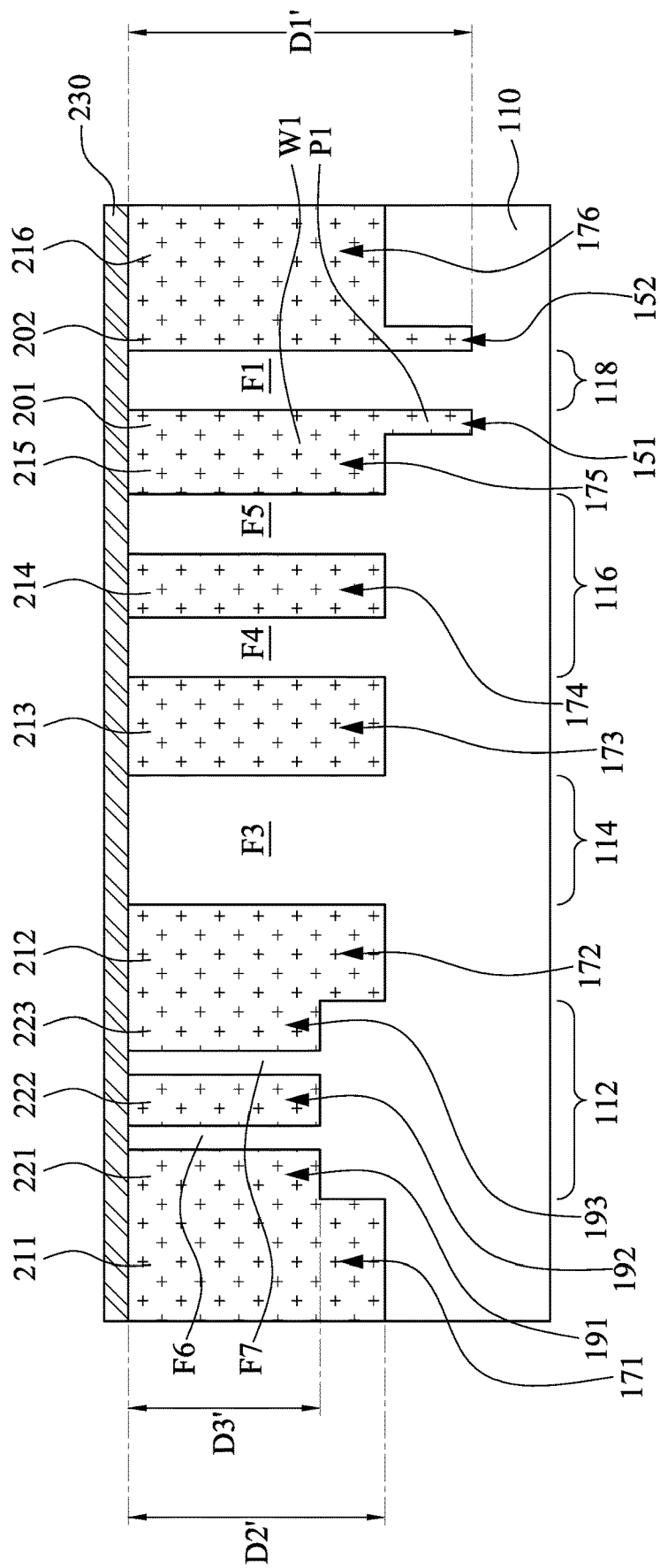

Reference is made to FIG. 9. Sacrificial layer 230 is formed on at least the semiconductor fins F1 and F3-F7. The sacrificial layer 230 may be used for implantation screening and reduction of the channeling effect during the subsequent implantation. The sacrificial layer 230 may be an oxide layer formed, for example, using CVD or PVD. Next, ion implantation process is performed to impart impurities to the semiconductor fins F1 and F3-F7 and to form wells in the semiconductor substrate 110.

Figure 10:
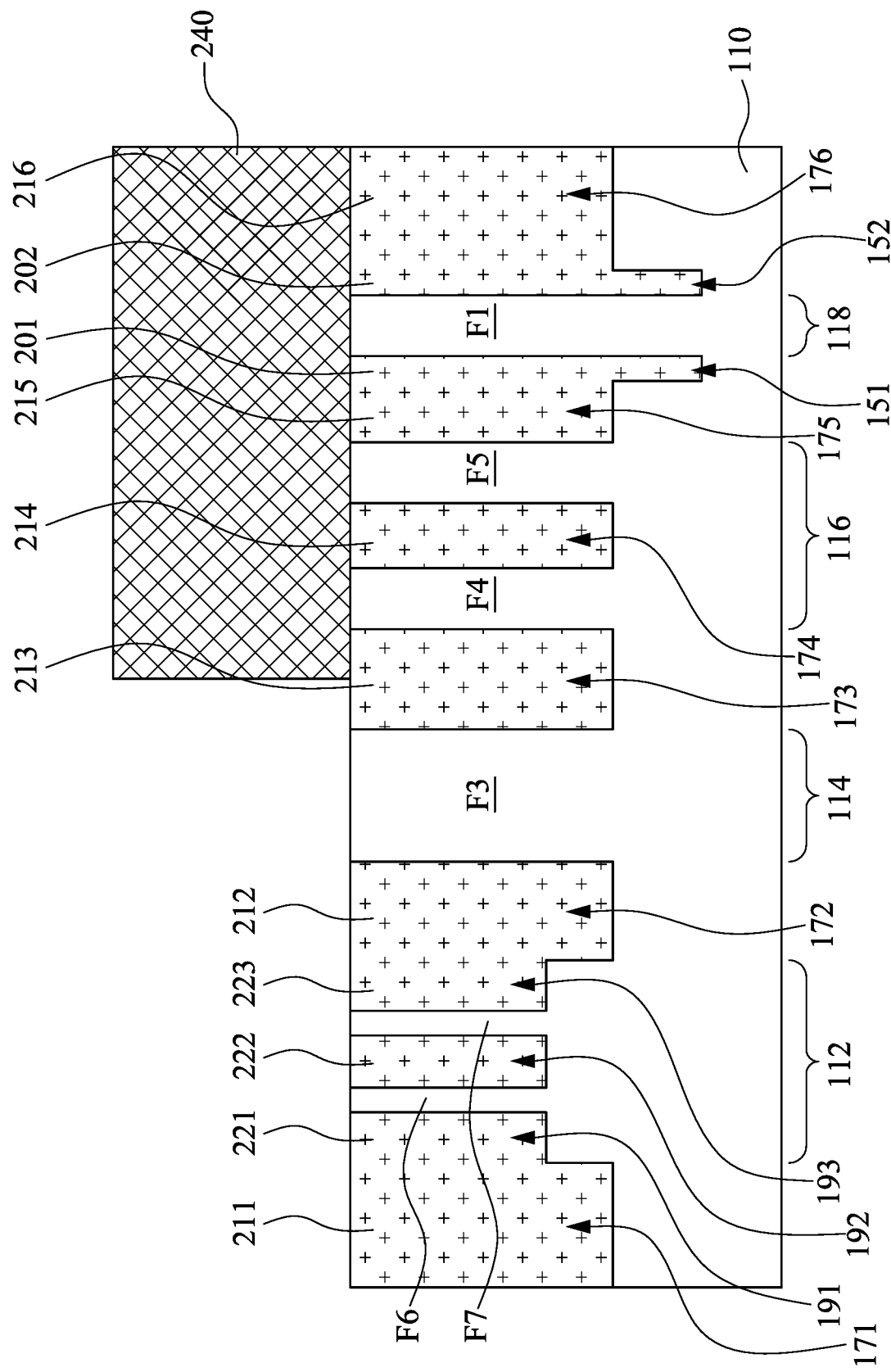

Reference is made to FIG. 10. The sacrificial layer 230 is removed, and then mask 240 is applied to mask or cover a portion of the substrate 110, leaving another portion of the substrate 110 exposed. The mask 240 may be a photoresist. This photoresist is applied to an entirety of the substrate 110 and then patterned so that portions of the mask 240 over parts of the substrate 110 with STIs 201, 202 and 214-216 remain. The STIs 211, 212 and 221-223 are exposed by the mask 240. In some embodiments, a portion of the second STI 213 is covered, and a portion of the third STI 213 is exposed.

Figure 11:
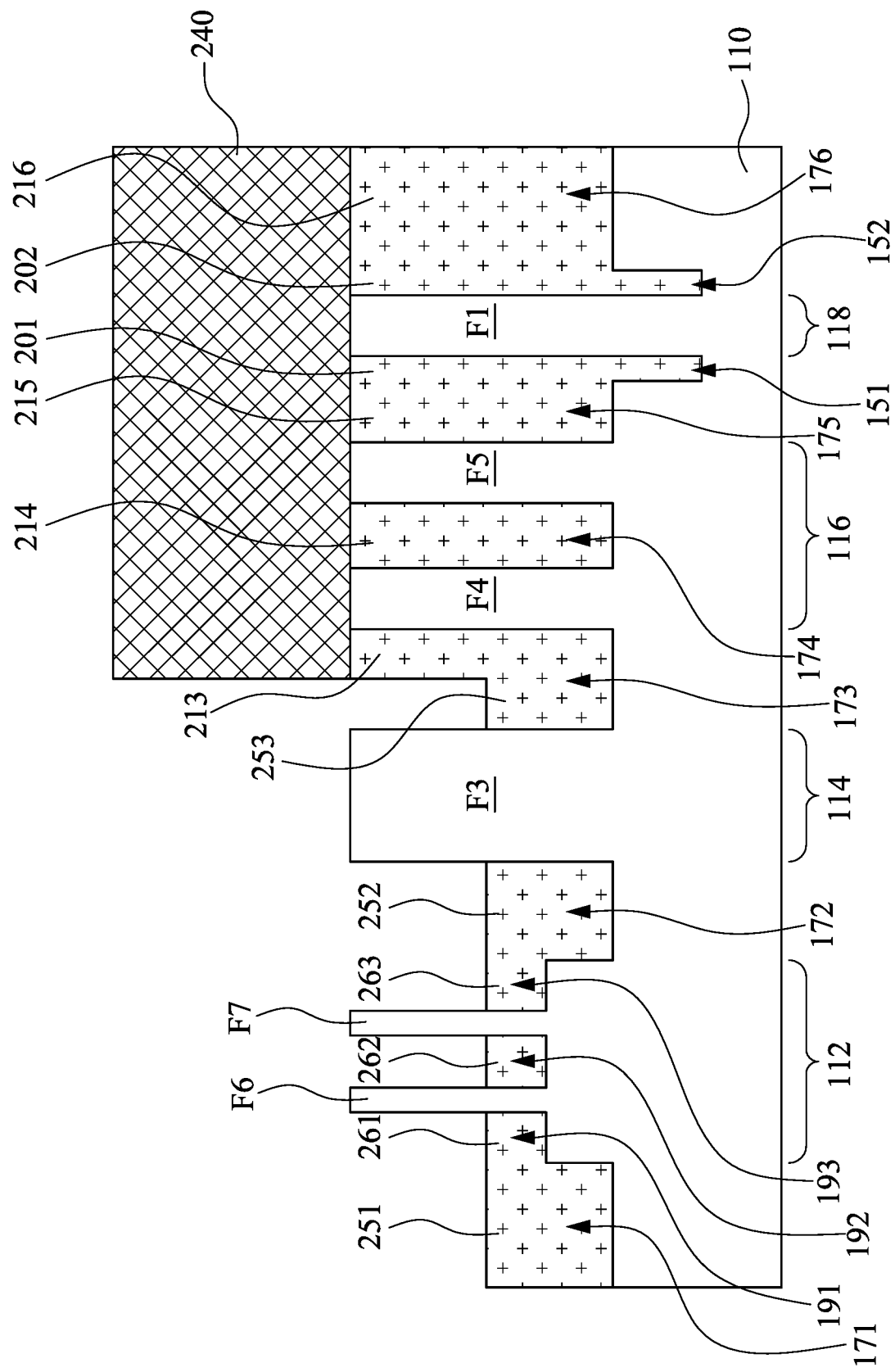

The exposed STIs are then recessed through an etching process until upper portions of the semiconductor fins F3, F6 and F7 are exposed, resulting in recessed or lowered fourth STIs 251, 252, 253, and fifth 261, 262 and 263 on the semiconductor substrate 110, and the resulting structure is shown in FIG. 11. As illustrated, the second STIs 211 and 212 are recessed to form the recessed fourth STIs 251 and 252, and the third STIs 221-223 are recessed to form the recessed fifth STIs 261-263. In some embodiments, an unmasked portion of the second STI 213 between semiconductor fins F3 and F4 is recessed to form the recessed fourth STI 253, and a masked portion of the STI 213 is not recessed by this etching process. In some embodiments, the etching process may be a wet etching process, for example, by dipping the substrate 110 in hydrofluoric acid (HF). In alternative embodiments, the etching process may be a dry etching process, for example, the dry etching process may be performed using $CHF_3$ or $BF_3$ as etching gases. Since the STIs 251-253 and 261-263 are recessed using the same etching process and at the same time, the STIs 251-253 and 261-263 can have top surfaces at substantially the same height. After the etching process, the mask 240 is removed. In some embodiments, a ratio of the thickness of fifth STI 263 to the thickness of the fourth STI 252 abutting the fifth STI 263 ranges from about 0.3 to about 0.8.

Figure 12:
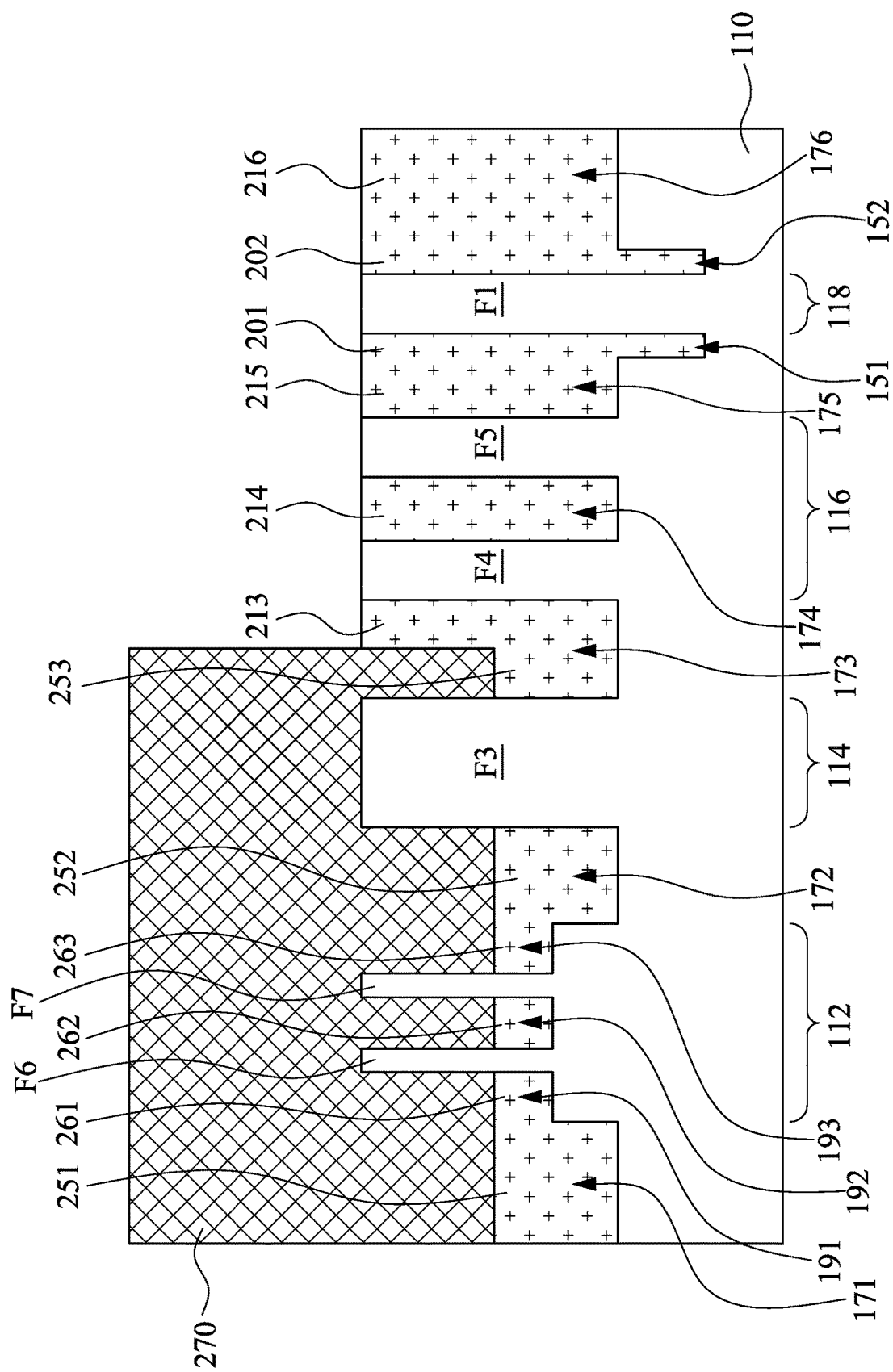

Reference is made to FIG. 12, mask 270 is applied to mask or cover a portion of the substrate 110, leaving another portion of the substrate 110 exposed. The mask 270 may be a photoresist. This photoresist is applied to an entirety of the substrate 110 and then patterned so that portions of the mask 270 over parts of the substrate 110 with recessed STIs 251-253 and 261-263 remain. The non-recessed STIs 201, 202 and 213-216 are exposed by the mask 270.

Figure 13:
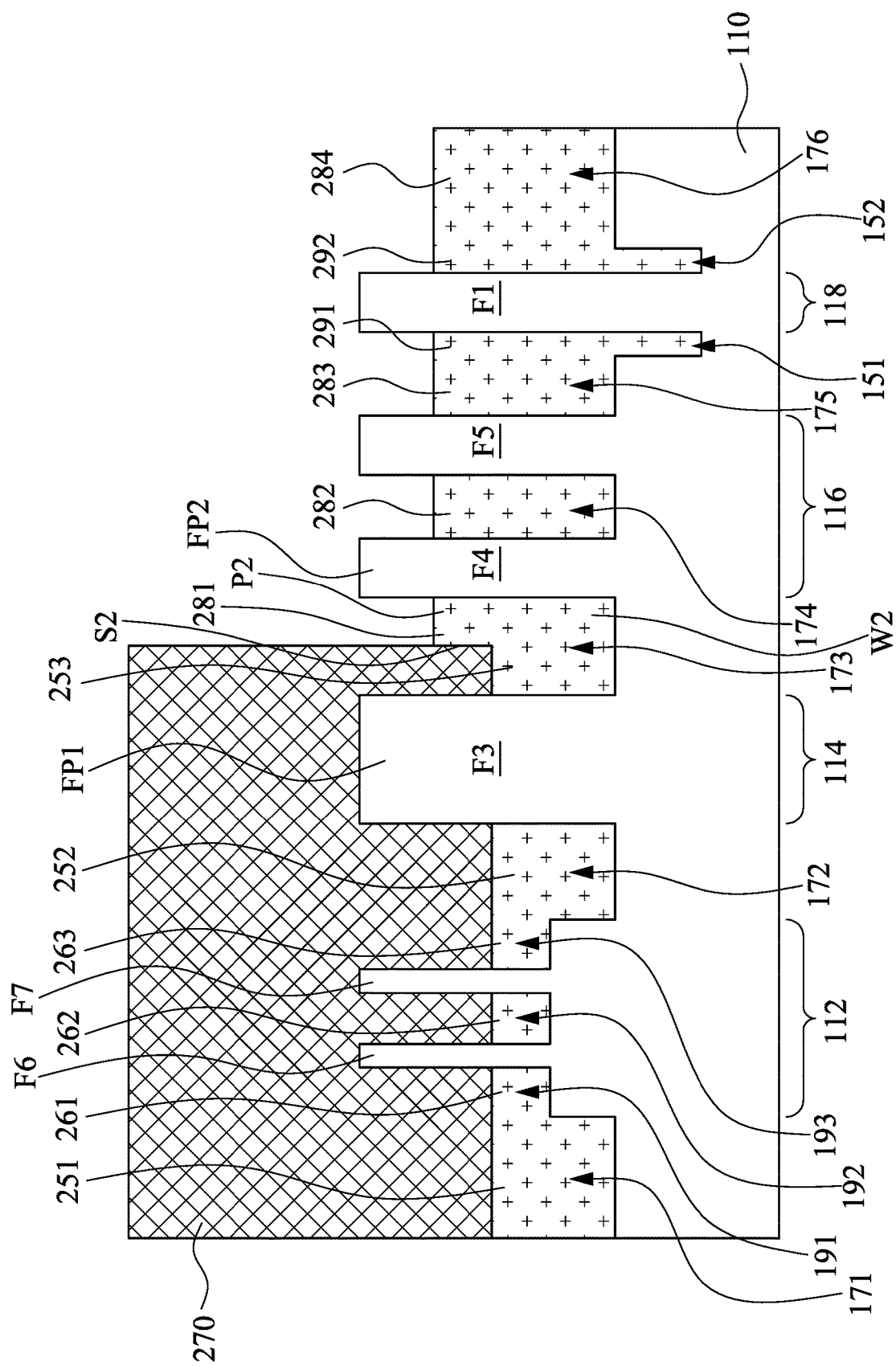

The exposed STIs are then recessed through an etching process until upper portions of the semiconductor fins F1, F4 and F5 are exposed, resulting in recessed or lowered sixth STIs 281, 282, 283, and 284, and seventh STIs 291 and 292 on the semiconductor substrate 110, and the resulting structure is shown in FIG. 13. As illustrated, the second STIs 214-216 are recessed to form the recessed sixth STIs 282-284, and the first STIs 201 and 202 are recessed to form the recessed seventh STIs 291 and 292. A remaining portion of the second STI 213 is recessed to form the recessed sixth STI 281. In some embodiments, the etching process may be a wet etching process, for example, by dipping the substrate 110 in hydrofluoric acid (HF). In alternative embodiments, the etching process may be a dry etching process, for example, the dry etching process may be performed using $CHF_3$ or $BF_3$ as etching gases. Since the STIs 281-284 and 291-292 are recessed using the same etching process and at the same time, the STIs 281-284 and 291-292 can have top surfaces at substantially the same height. In some embodiments, the STIs 281-284 and 291-292 have top surfaces at the height different from a height of the top surfaces of the STIs 251-253 and 261-263. For example, the top surfaces of the STIs 281-284 and 291-292 may be located in positions higher than the top surfaces of the STIs 251-253 and 261-263. This top height difference can be controlled using etching parameters for STIs 281-284 and 291-292 different from that for STIs 251-253 and 261-263. In some embodiments, a ratio of the thickness of sixth STI 283 to the thickness of the seventh STI 291 abutting the sixth STI 283 ranges from about 1/12 to about 1/24.

In some embodiments, different portions of the second STI 213 between the semiconductor fins F3 and F4 is recessed through different etching processes, and therefore, the resulting recessed fourth STI 253 and sixth STI 281 between the adjacent semiconductor fins F3 and F4 can have different thicknesses. For example, the sixth STI 281 has a thickness greater than the thickness of the fourth STI 253, and the fourth STI 253 abuts the sixth STI 281. The thickness difference can be controlled using different etching parameters to etch the different portions of the STI 213. In some embodiments, the top surface of the fourth STI 253 is located in a position lower than the top surface of the sixth STI 281. The top height difference is beneficial to form the STIs 253 and 281 with different thicknesses. In some embodiments, a portion of the semiconductor fin F3 protrudes from the fourth STI 253 and can be referred to as a protrusion FP1, and a portion of the semiconductor fin F4 protrudes from the sixth STI 281 and can be referred to as a protrusion FP2. The protrusions FP1 and FP2 have different thicknesses due to the thickness difference between the STIs 253 and 281. In some embodiments, a ratio of the thickness of fourth STI 253 to the thickness of the sixth STI 281 ranges from about 1/1.2 to about 1/1.6.

The STIs 253 and 281 are abutted, monolithically connected, immediately adjacent, or in contact with to each other, and materials other than the STIs 253 and 281 are absent between the STIs 253 and 281. For example, a semiconductor feature, a conductive feature or a combination thereof is absent between the STIs 253 and 281. This arrangement may be advantageous to reduce the distance between semiconductor devices on the adjacent device regions 114 and 116 using different STI thicknesses. For example, the device regions 114 and 116 respectively have semiconductor fins F3 and F4 thereon, and the semiconductor fins F3 and F4 are adjacent, which means that an additional semiconductor fin is absent between the semiconductor fins F3 and F4. The STI isolating the semiconductor fins F3 and F4 may include the sixth STI 281 abutting the semiconductor fin F4 and the fourth STI 253 abutting the semiconductor fin F3. The sixth STI 281 abuts the fourth STI 253 as well. For example, the sixth STI 281 has a sidewall S2, and the fourth STI 253 abuts a lower region of the sidewall S2 of the sixth STI 281. Stated differently, the sixth STI 281 has a portion protruded from a top surface of the fourth STI 253. The abutted STIs 253 and 281 having different thicknesses may provide suitable isolations for the adjacent semiconductor fins F3 and F4, which are used to form semiconductor devices having different functions.

In some embodiments, the STI isolating the adjacent semiconductor fins F3 and F4 may include an STI W2 and a dielectric protrusion P2. The dielectric protrusion P2 protrudes from a top of the STI W2, and the dielectric protrusion P2 has a width less than the width of the STI W2. The dielectric protrusion P2 protrudes from the STI W2 in a direction farther away from the substrate 110. The dielectric protrusion P2 is closer to the semiconductor fin F4 than to the semiconductor fin F3. For example, the dielectric protrusion P2 abuts the semiconductor fin F4 and is spaced apart from the semiconductor fin F3. Stated differently, the isolation structure isolating the adjacent semiconductor fins F3 and F4 includes a first portion (i.e. STI 281) and a second portion (i.e. STI 253). The first portion is closer to the semiconductor fin F4 than the second portion, and the first portion is thicker than the second portion. For example, the isolation structure isolating two neighboring fins has a stepped top surface. Using this configuration, a portion of the STI adjacent to the semiconductor fin F4 has a thickness different from that adjacent to the semiconductor fin F3. This thickness difference may be advantageous to provide suitable isolations for the adjacent semiconductor fins F3 and F4.

In some embodiments, top surfaces of the STIs 253 and 291 are located at different heights, and bottom surfaces of the STIs 253 and 291 are located at different heights as well. Such differences may provide further different isolations suitable for the semiconductor fins F1 and F3. In some embodiments, a height difference between the top surfaces of the STIs 253 and 291 is different from that between the bottom surfaces of the STIs 253 and 291. Such a difference may provide further different isolation structures having different thicknesses suitable for the semiconductor fins F1 and F3.

Figure 14:
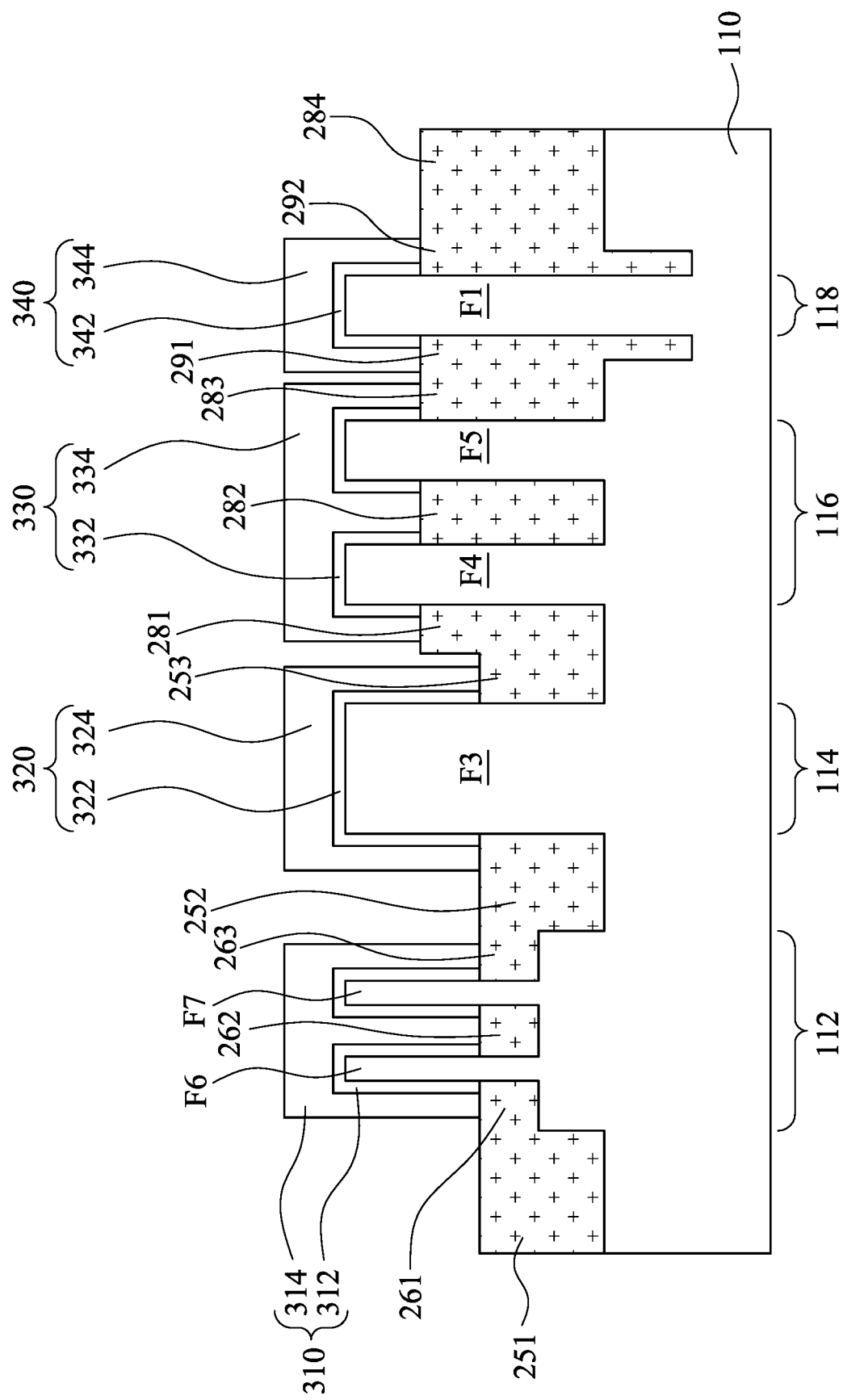
Figure 15:
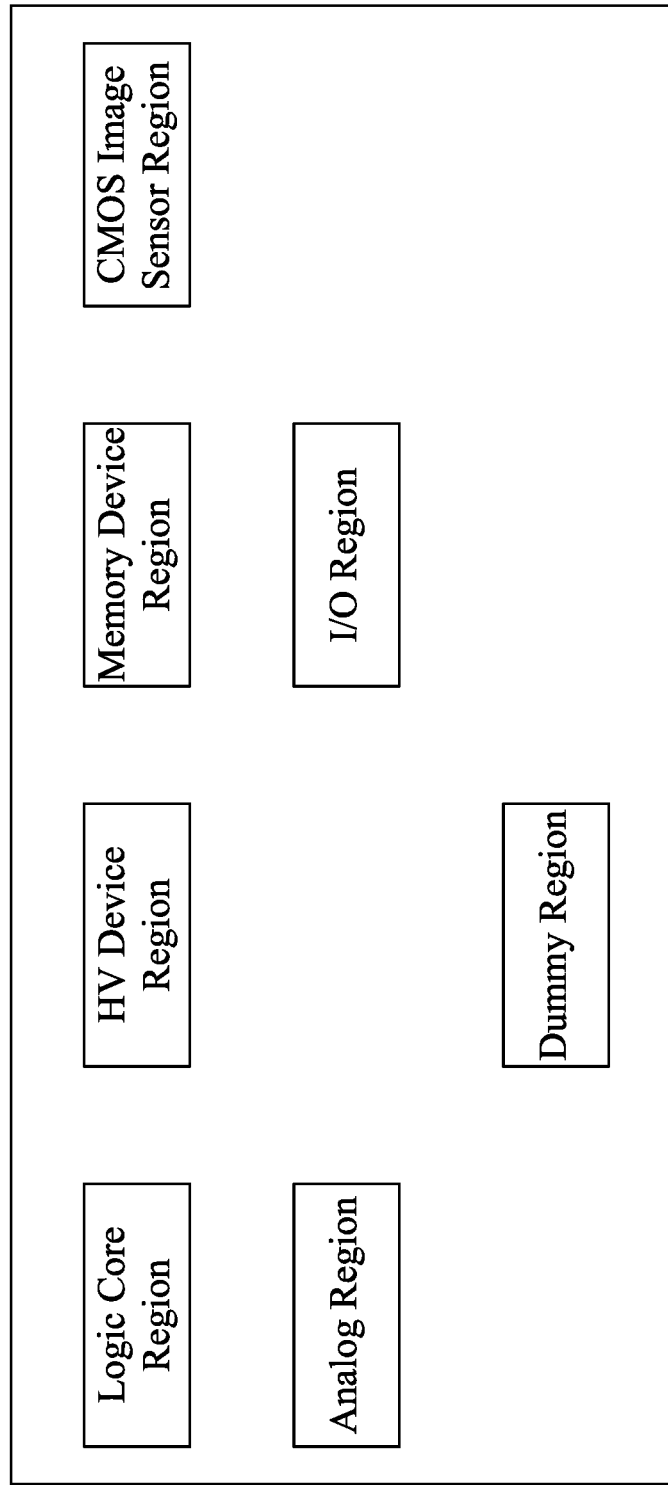
FIG. 15 is a top view of an integrated circuit in accordance with some embodiments of the present disclosure.

FIG. 14 illustrates the formation of gate structures 310, 320, 330 and 340 in device regions 112, 114, 116 and 118, respectively. The gate structures 320 and 330 have bottom surfaces at different heights due to that the STIs 253 and 281 respectively underlie the gate structures 320 and 330 having top surfaces at different heights. For example, the bottom surface of the gate structure 320 is lower than the bottom surface of the gate structure 330. Gate dielectric 312 of the gate structure 310 is formed to wrap the semiconductor fins F6 and F7 on the logic device region 112. Gate electrode 314 of the gate structure 310 is then formed on gate dielectric 312. Gate dielectric 322 of the gate structure 320 is formed to wrap the semiconductor fin F3 on the HV device region 114. Gate electrode 324 of the gate structure 320 is then formed on gate dielectric 322. Gate dielectric 332 of the gate structure 330 is formed to wrap the semiconductor fins F4 and F5 on the memory device region 116. Gate electrode 334 of the gate structure 330 is then formed on gate dielectric 332. Gate dielectric 342 of the gate structure 340 is formed to wrap the semiconductor fin F1 on the CMOS image sensor region 118. Gate electrode 344 of the gate structure 340 is then formed on gate dielectric 342.

In some embodiments, gate dielectrics 312-342 may include dielectric materials, such as high-k dielectric materials, suitable for the corresponding device regions 112-118 formed by a suitable technique, such as CVD or PVD. Gate electrodes 314-344 may include conductors, such as metals, suitable for the corresponding device regions 112-118 formed by a suitable technique, such as CVD or PVD. Source/drain regions for the semiconductor fins F1 and F3-F7 can be formed before or after the formation of the gate structures 310-340, for example, using a suitable technique, such as implant processes or combinations of epitaxy processes and implant processes. As a result, semiconductor devices can be formed on the device regions 112-118.

Figure 16:
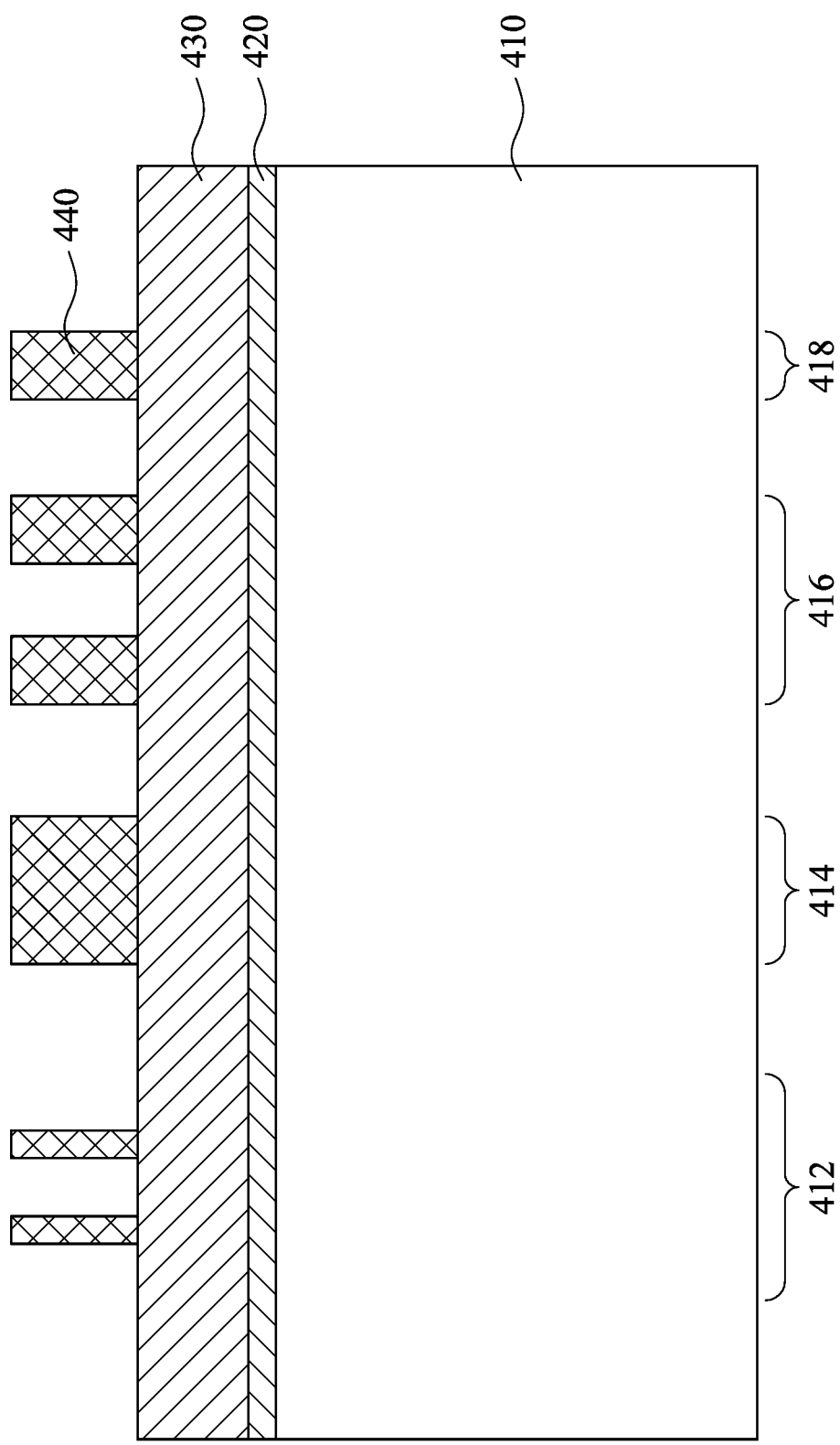
FIGS. 16-28 are cross-sectional views of a method for manufacturing an integrated circuit at various stages in accordance with some embodiments of the present disclosure.

FIGS. 16-28 are cross-sectional views of a method for manufacturing an integrated circuit at various stages in accordance with some embodiments of the present disclosure. As shown in FIG. 16, semiconductor substrate 410 includes portions in device regions 412, 414, 416 and 418. In some embodiments, device regions 412, 414, 416 and 418 are different regions exemplarily including a logic core region, a high voltage (HV) device region, a memory device region (such as an embedded non-volatile memory (NVM) region or an embedded static random access memory (SRAM) region), a CMOS image sensor region, an analog region, an input/output region, a dummy region (for forming dummy patterns), or the like. The above-referenced device regions are schematically illustrated in FIG. 15. In some exemplary embodiments, the device region 412 is a logic core region, the device region 414 is a HV device region, the device region 416 is a memory device region, and the device region 418 is a CMOS image sensor region.

Pad layer 420 and mask layer 430 are formed on semiconductor substrate 410. The pad layer 420 may be a thin film comprising silicon oxide formed, for example, using a thermal oxidation process, a deposition process, such as chemical vapor deposition (CVD), physical vapor deposition (PVD), or other suitable processes. The pad layer 420 acts as an adhesion layer between semiconductor substrate 410 and mask layer 430, and it can be formed of silicon nitride, for example, using low-pressure chemical vapor deposition (LPCVD), thermal nitridation of silicon, plasma enhanced chemical vapor deposition (PECVD), or plasma anodic nitridation.

Mask 440 is formed over the mask layer 430. As shown in FIG. 16, the mask 440 may be a photoresist, and it can be patterned by exposure and development, with openings in the mask 440 corresponding to locations of trenches to be created. The remaining photoresist material protects the underlying material from subsequent processing step performed in FIG. 17, such as etching.

Figure 17:
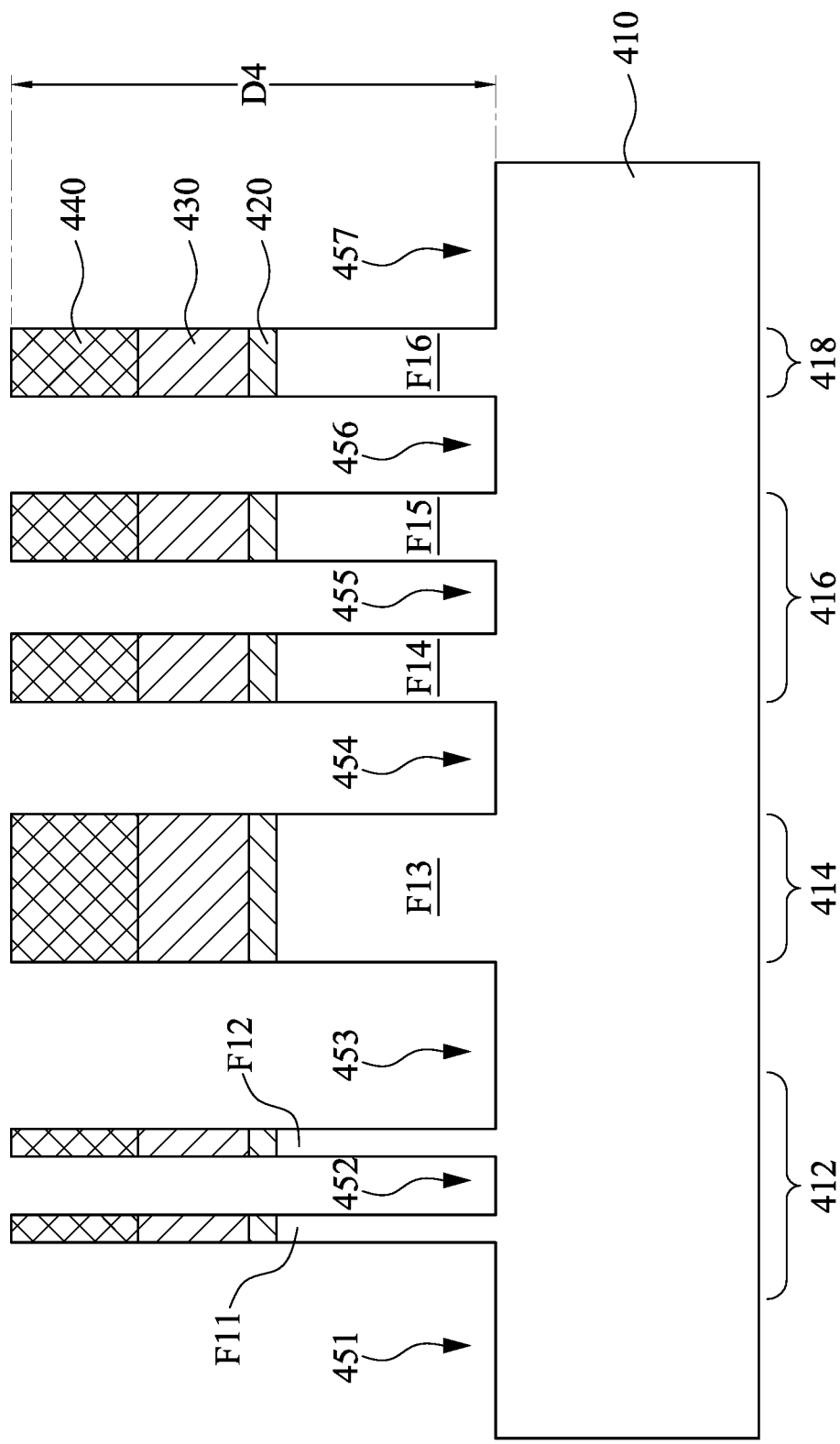

Reference is made to FIG. 17. Unmasked portions of the semiconductor substrate 410 are removed or recessed to form first trenches 451-457, and semiconductors F11-F16 are formed as well. For example, the first trenches 451 and 452 are etched into the semiconductor substrate 410, and a portion of semiconductor substrate 410 between first trenches 451 and 452 thus becomes the semiconductor fin F11 protruding from a portion of the semiconductor substrate 410 underlying the first trenches 451 and 452. The first trenches 453-457 and the semiconductor fins F12-F16 are also formed in a similar manner. The etching of the first trenches 451-457 may be performed using any of a variety of substrate etching techniques, such as plasma etching at a variety of pressures, temperatures, and so forth. The etching technique may also etch through the mask layer 430 and the pad layer 420. Since the first trenches 451-457 are etched using the same etching process and at the same time, the first trenches 451-457 can have substantially the same depth, i.e., a first depth D4.

Figure 18:
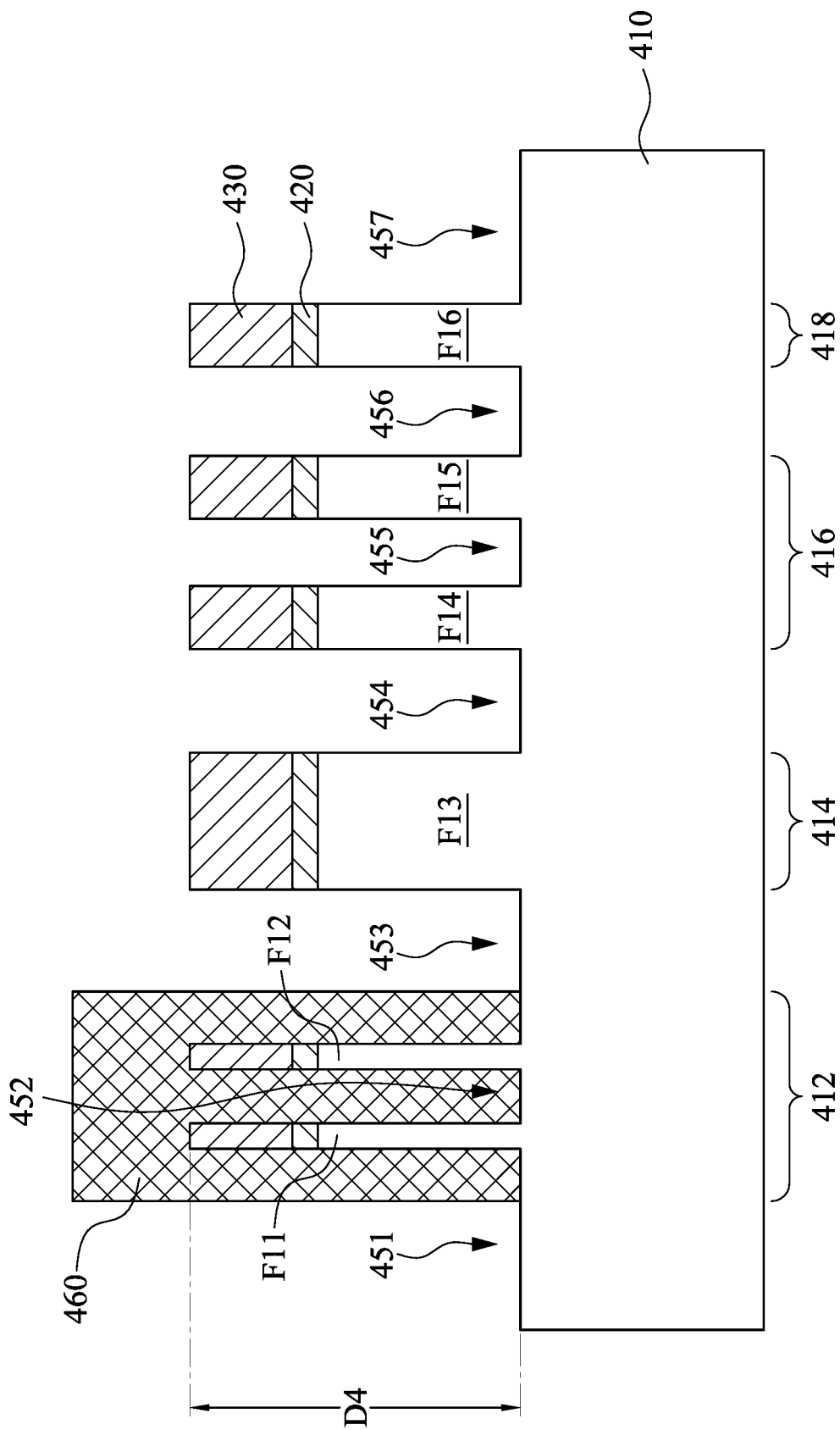

Reference is made to FIG. 18. The mask 440 in FIG. 17 is removed, for example, using an ashing process. Next, a mask 460 is applied to the substrate 410 to protect some of the first trenches 451-457 already created on the substrate 410. The mask 460 may be a photoresist. This photoresist is applied to an entirety of the substrate 410 and then patterned so that portions of the mask 460 over parts of the substrate 410 with some of first trenches 451-457 already at a desired depth remain. A pattern may be applied to the mask 460, and this pattern is for use in deepening one or more trenches already at the first depth D4 to a second depth. The pattern includes openings in the mask 460 to expose one or more trenches to be deepened.

Figure 19:
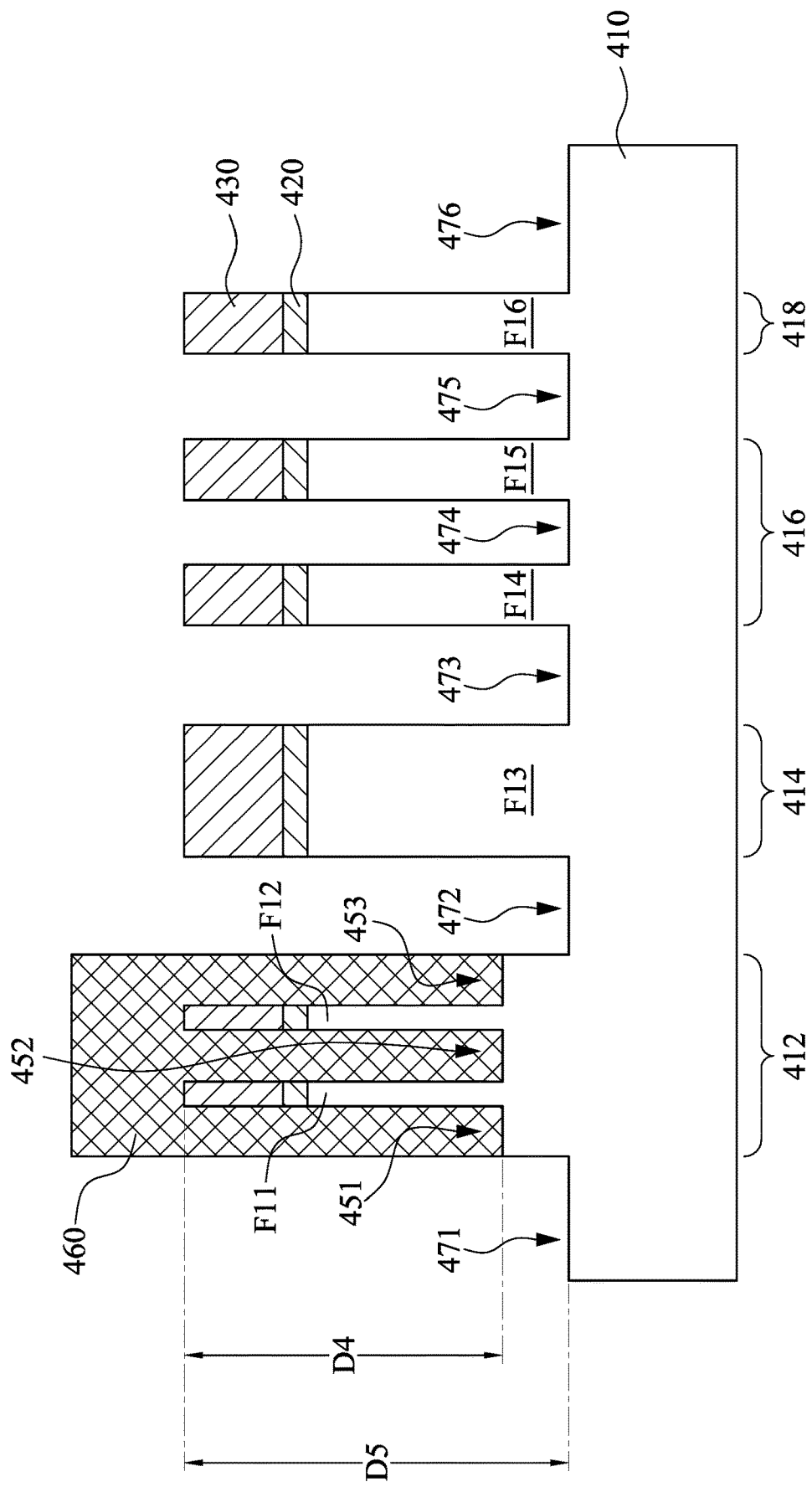

Reference is made to FIG. 19. Second trenches 471-476 at a second depth D5, are etched into substrate 410. The second trenches 471-476 at the second depth D5 may be formed by additional etching of the unmasked trenches at the first depth D4, wherein the first depth D4 is less than the second depth D5. In other words, some trenches at the first depth D4 are deepened to from the second trenches 417-476 at the second depth D5. Some masked trenches are not deepened, such as the first trench 452 and portions of the trenches 451 and 453. The etching of the second trenches 471-476 may be performed using any of a variety of substrate etching techniques, such as plasma etching at a variety of pressures, temperatures, and so forth. Since the second trenches 471-476 are etched using the same etching process and at the same time, the second trenches 471-476 can have substantially the same depth, i.e. the second depth D5.

Figure 20:
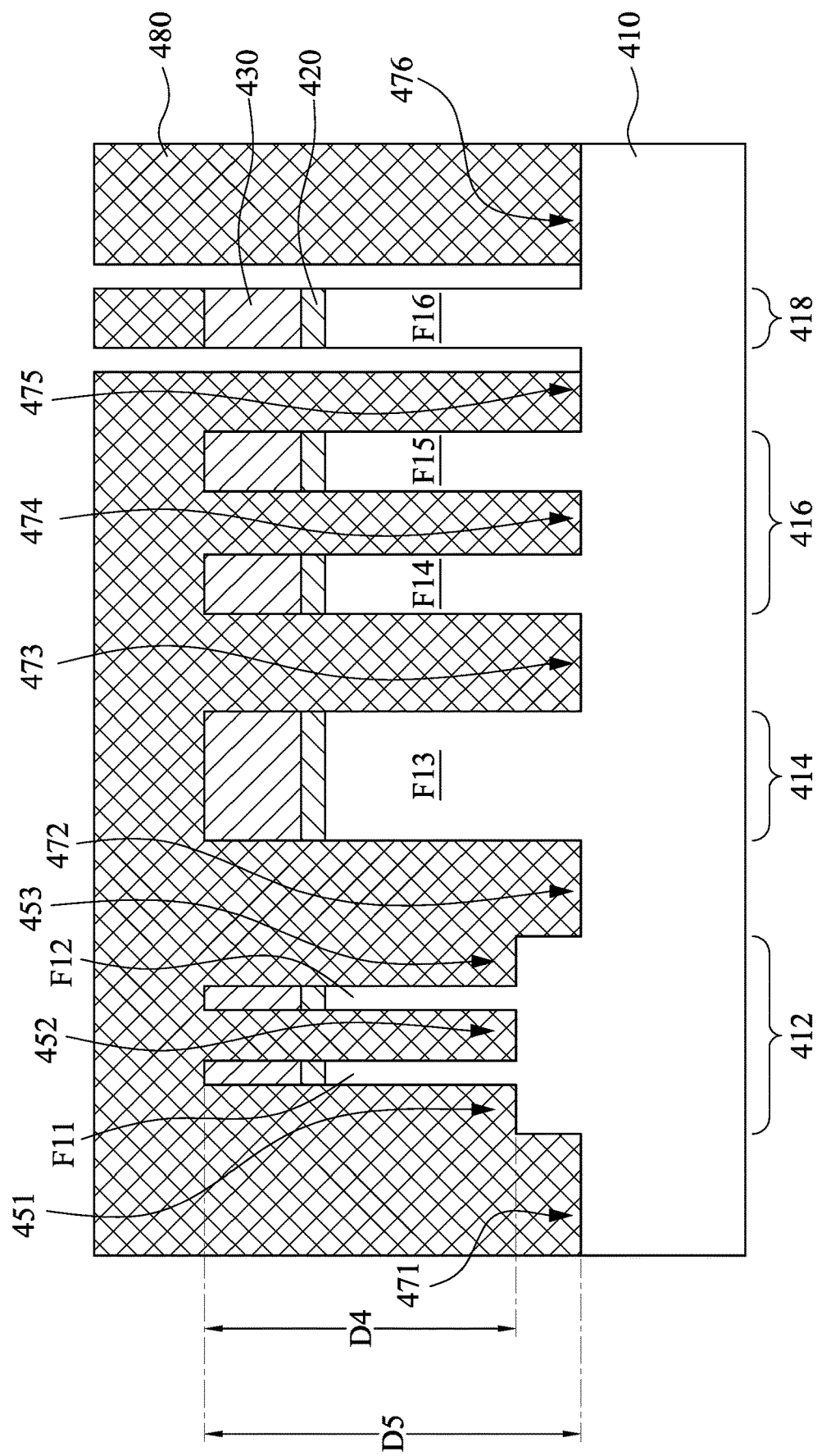

Reference is made to FIG. 20. The mask 460 in FIG. 19 is removed, for example, using an ashing process. Next, a mask 480 is applied to the substrate 410 to protect some of the first trenches 451-453 and second trenches 471-476 already created on the substrate 410. The mask 480 may be a photoresist. This photoresist is applied to an entirety of the substrate 410 and then patterned so that portions of the mask 480 over parts of the substrate 410 with some trenches 451-453 and 471-476 already at a desired depth remain. A pattern may be applied to the mask 480, and this pattern is for use in deepening one or more trenches already at the second depth D5 to a third depth. The pattern includes openings in the mask 480 to expose one or more trenches to be deepened.

Figure 21:
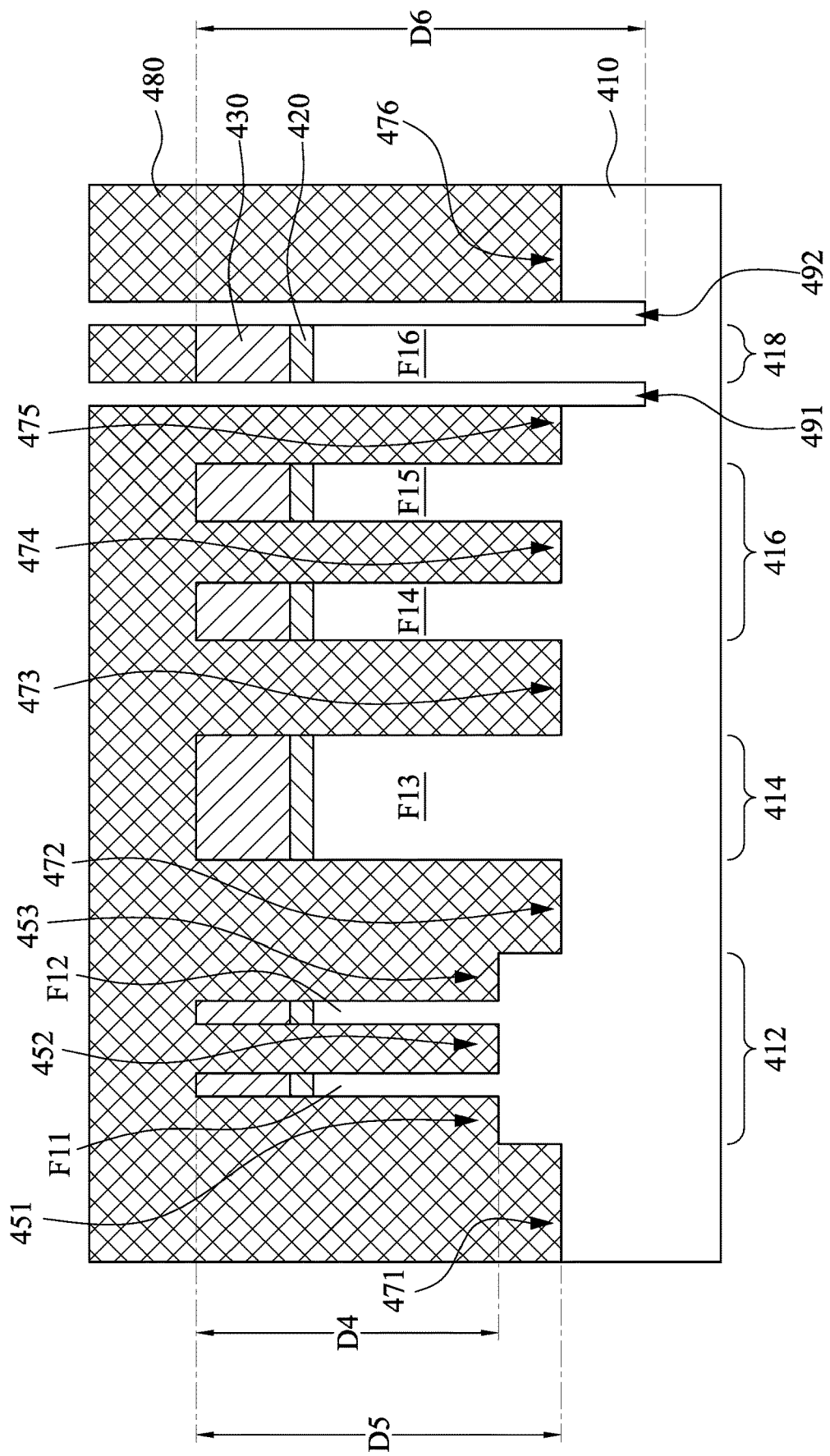

Reference is made to FIG. 21. Third trenches 491 and 492 at a third depth D6, are etched into substrate 410. The third trenches 491 and 492 at the third depth D6 may be formed by additional etching of the unmasked trenches at the second depth D5, wherein the second depth D5 is less than the third depth D6. In other words, some trenches at the second depth D5 are deepened to from the third trenches 491 and 492 at the third depth D6. Some masked trenches are not deepened and can be referred to as non-deepened trenches. The etching of the third trenches 491 and 492 may be performed using any of a variety of substrate etching techniques, such as plasma etching at a variety of pressures, temperatures, and so forth. Since the third trenches 491 and 492 are etched using the same etching process and at the same time, the third trenches 491 and 492 can have substantially the same depth, i.e. the third depth D6. In some embodiments, the non-deepened trenches 475 and 476 at the second depth D5 may be adjacent to the deepened trenches 491 and 492 at the third depth D6, respectively. Stated differently, the second trench 475 and the third trench 491 deeper than the second trench 475 are communicated after the mask 480 is removed. Similarly, the second trench 476 and the third trench 492 deeper than the second trench 476 are communicated after the mask 480 is removed as well.

Figure 22:
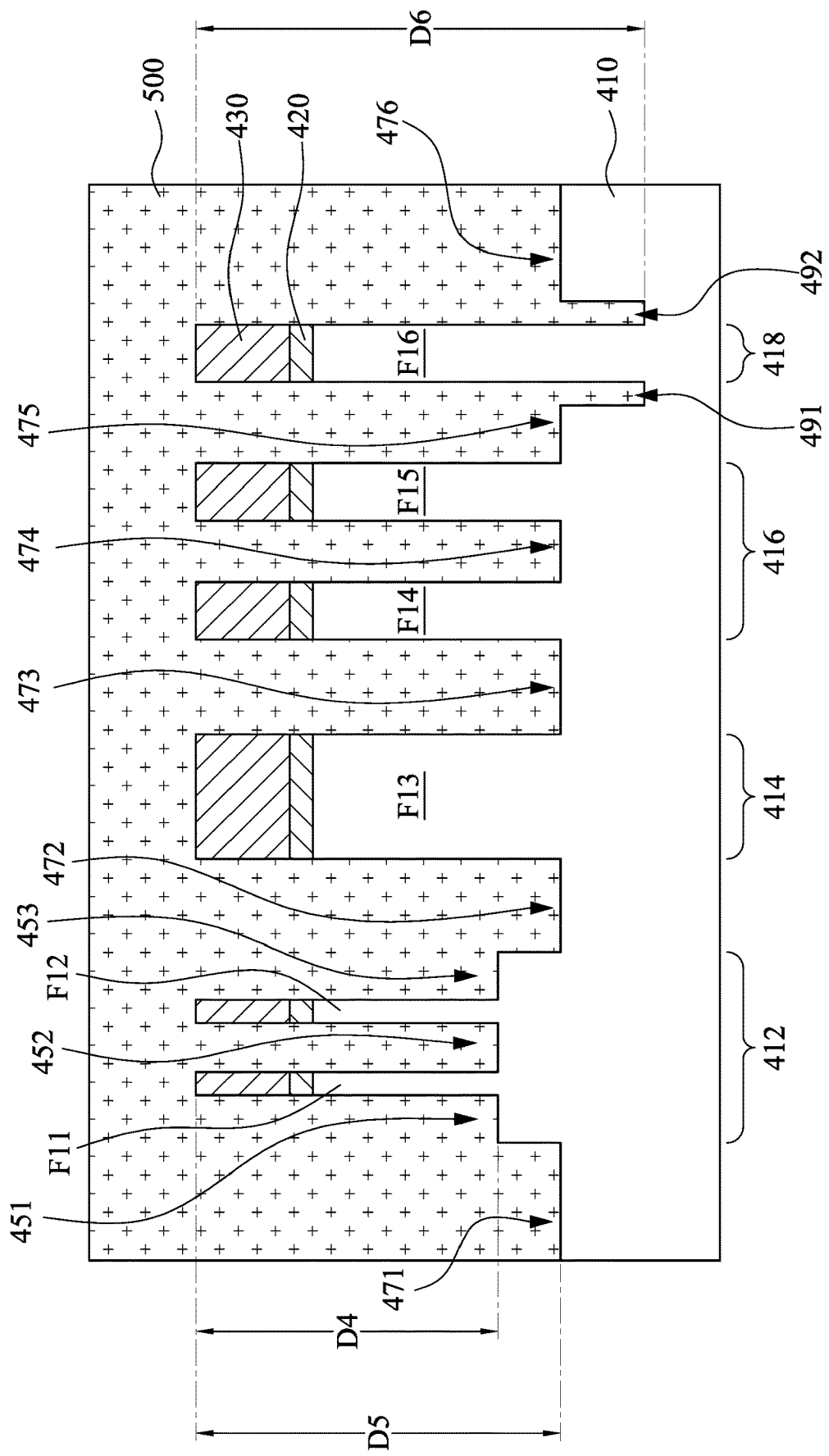

Reference is made to FIG. 22. The mask 480 in FIG. 21 is removed, for example, using an ashing process. Thereafter, a dielectric feature 500 is formed on the substrate 410 to cover the semiconductor fins F11-F16 and to fill the trenches 451-453, 471-476 and 491-492. The dielectric feature 500 includes a material such as silicon oxide, silicon nitride, silicon oxynitride, low-k materials, other suitable material, or any combinations thereof, formed using suitable techniques as discussed previously.

Figure 23:
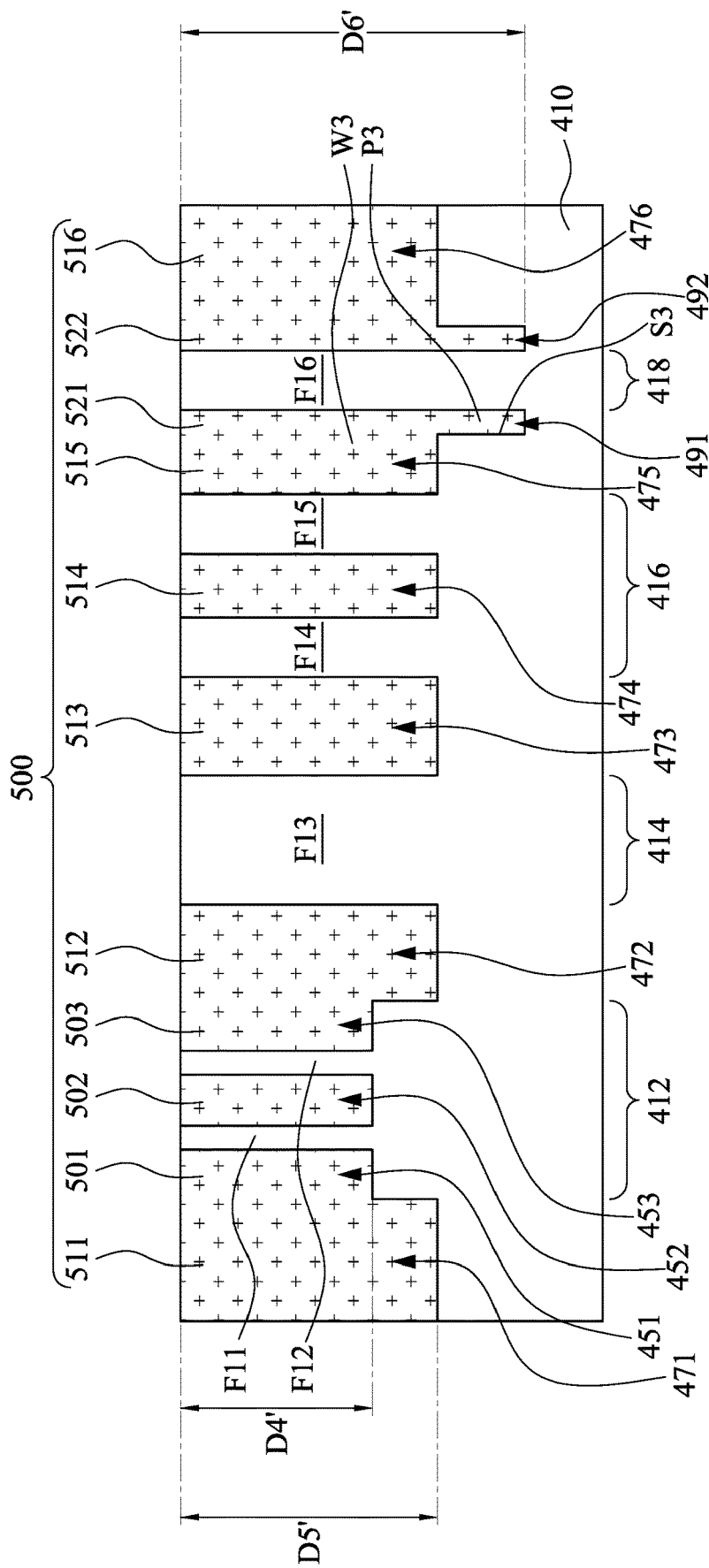

Next, as shown in FIG. 23, planarization process, such as a chemical mechanical polishing (CMP) process is performed to remove excess dielectric feature 500 outside the trenches 451-453, 471-476 and 491-492. The planarization process may also remove the pad layer 420 and the mask layer 430 such that the semiconductor fins F11-F16 are exposed. After the planarization, portions of the dielectric feature 500 filling the first trenches 451-453 can be referred to first shallow trench isolations (STIs) 501-503, portions of the dielectric feature 500 filling the second trenches 471-476 can be referred to as second STIs 511-516, and portions of the dielectric feature 500 filling the third trenches 491 and 492 can be referred to as third STIs 521 and 522. These STIs can be referred to as isolation structures in some embodiments.

The planarization process may reduce the first, second and third depths D4, D5 and D6 to first, second and third depth D4', D5' and D6', respectively. That is, after the planarization process, the first trenches 451-453 have reduced first depth D4', the second trenches 471-476 have reduced second depth D5', and the third trenches 491 and 492 have reduced third depth D6'. The first STIs 501-503 filling the first trenches 451-453 may have substantially the same thickness, which is substantially equal to the first depth D4'. The second STIs 511-516 filling the second trenches 471-476 may have substantially the same thickness, which is substantially equal to the second depth D5'. The third STIs 521 and 522 filling the third trenches 491 and 492 may have substantially the same thickness, which is substantially equal to the third depth D6'. Since the planarization process form a substantial planar surface for the structure shown in FIG. 23, the reduced first, second and third depth D4', D5' and D6' may satisfy: D4'<D5'<D6', which is similar to D4<D5<D6. Therefore, thicknesses of the third STIs 521 and 522 are greater than the thicknesses of the second STIs 511-516, and thicknesses of the second STIs 511-516 are greater than the thicknesses of the first STIs 501-503 at this stage. Such thickness differences may be advantageous to provide various isolations suitable for different device regions 412-418 that have different functions.

In some embodiments, the third STIs 521 and second 515 respectively filling the third trench 491 and the second trench 475 that are communicated with each other, and hence the third STI 521 abuts the second STI 515, and the third STI 521 is thicker than the second STI 515. Stated differently, the third STI 521 and the second STI 515 are monolithically connected, immediately adjacent, or in contact with to each other, and materials other than the STIs 521 and 515 are absent between the STIs 521 and 515. For example, a semiconductor feature, a conductive feature or a combination thereof is absent between the STIs 521 and 515. For example, the third STI 521 has a sidewall S3, and the second STI 515 abuts an upper region of the sidewall S3. Stated differently, the third STI 521 has a portion protruded from a bottom surface of the second STI 515. This arrangement may be advantageous to reduce the distance between semiconductor devices on the adjacent device regions 416 and 418 using different STI thicknesses. For example, the device regions 416 and 418 respectively have semiconductor fins F15 and F16 thereon, and the semiconductor fins F15 and F16 are adjacent, which means that an additional semiconductor fin is absent between the semiconductor fins F15 and F16. The STI isolating the adjacent semiconductor fins F15 and F16 may include a third STI 521 abutting the semiconductor fin F16 and a second STI 515 abutting the semiconductor fin F15, and the STIs 521 and 515 are abutted as well.

In some embodiments, the third STIs 521 and 522 have bottom surfaces at a height different from a height of the bottom surfaces of the second STIs 511-516, and the bottom surfaces of the second STIs 511-516 are located at a height different from a height of the bottom surfaces of the first STIs 501-503. For example, the bottom surface of the third STI 521 is located at the height lower than a height of the bottom surface of its neighboring second STI 515. This bottom height difference may be beneficial to make the third STI 521 thicker than the second STI 515. Stated differently, the STI isolating the adjacent semiconductor fins F16 and F15 may include an STI W3 and a dielectric protrusion P3. The dielectric protrusion P3 protrudes from a bottom of the STI W3, and the dielectric protrusion P3 has a width less than a width of the STI W3. The dielectric protrusion P3 protrudes from the STI W3 toward the substrate 410. The dielectric protrusion P3 is closer to the semiconductor fin F16 than to the semiconductor fin F15. For example, the dielectric protrusion P3 abuts the semiconductor fin F16 and is spaced apart from the semiconductor fin F15. Stated differently, the isolation structure isolating the adjacent semiconductor fins F15 and F16 includes a first portion (i.e. STI 521) and a second portion (i.e. STI 515). The first portion is closer to the semiconductor fin F16 than the second portion, and the first portion is thicker than the second portion. For example, the isolation structure isolating two neighboring fins has a stepped bottom surface. Using this configuration, a portion of the STI adjacent to the semiconductor fin F16 has a thickness different from that adjacent to the semiconductor fin F15. This thickness difference may be advantageous to provide suitable isolations for the adjacent semiconductor fins F16 and F15.

Figure 24:
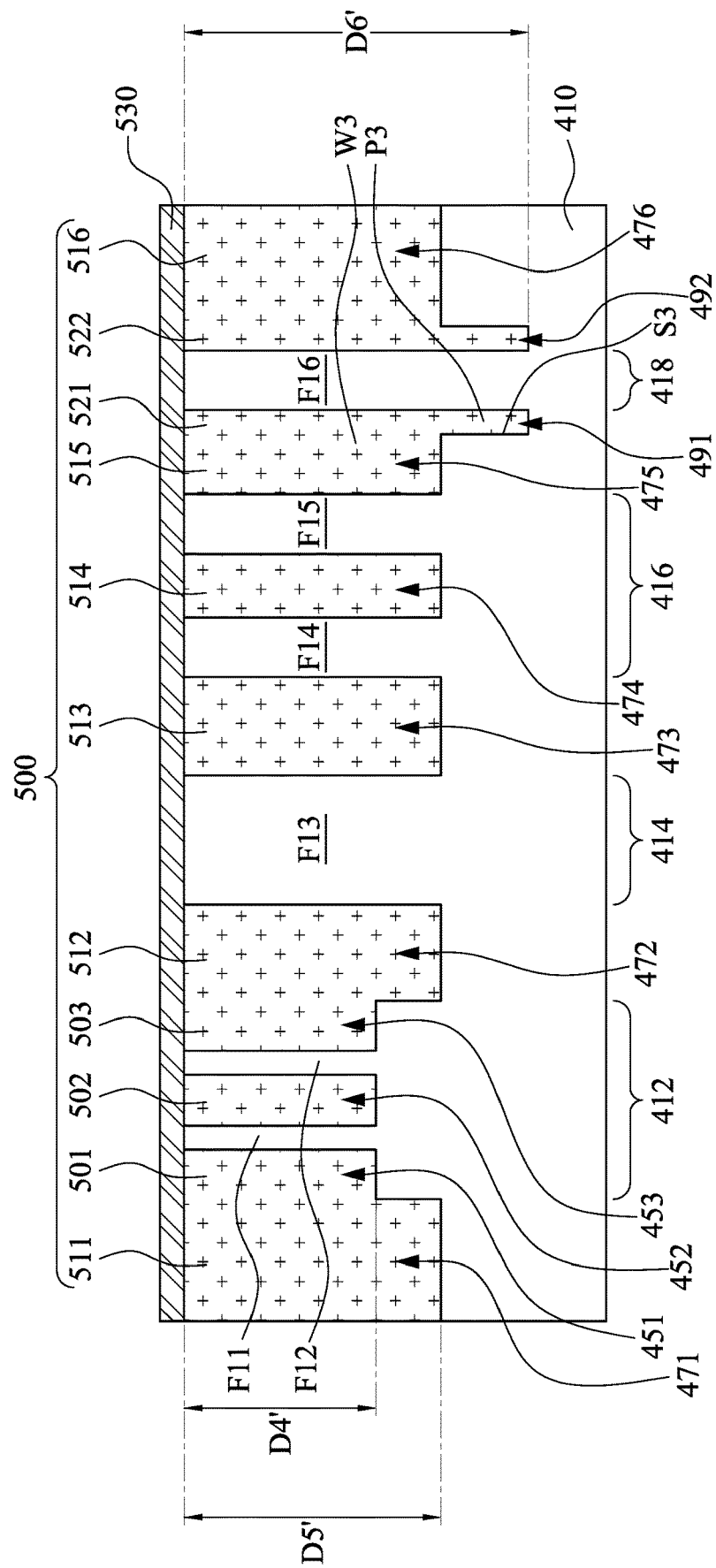
Figure 25:
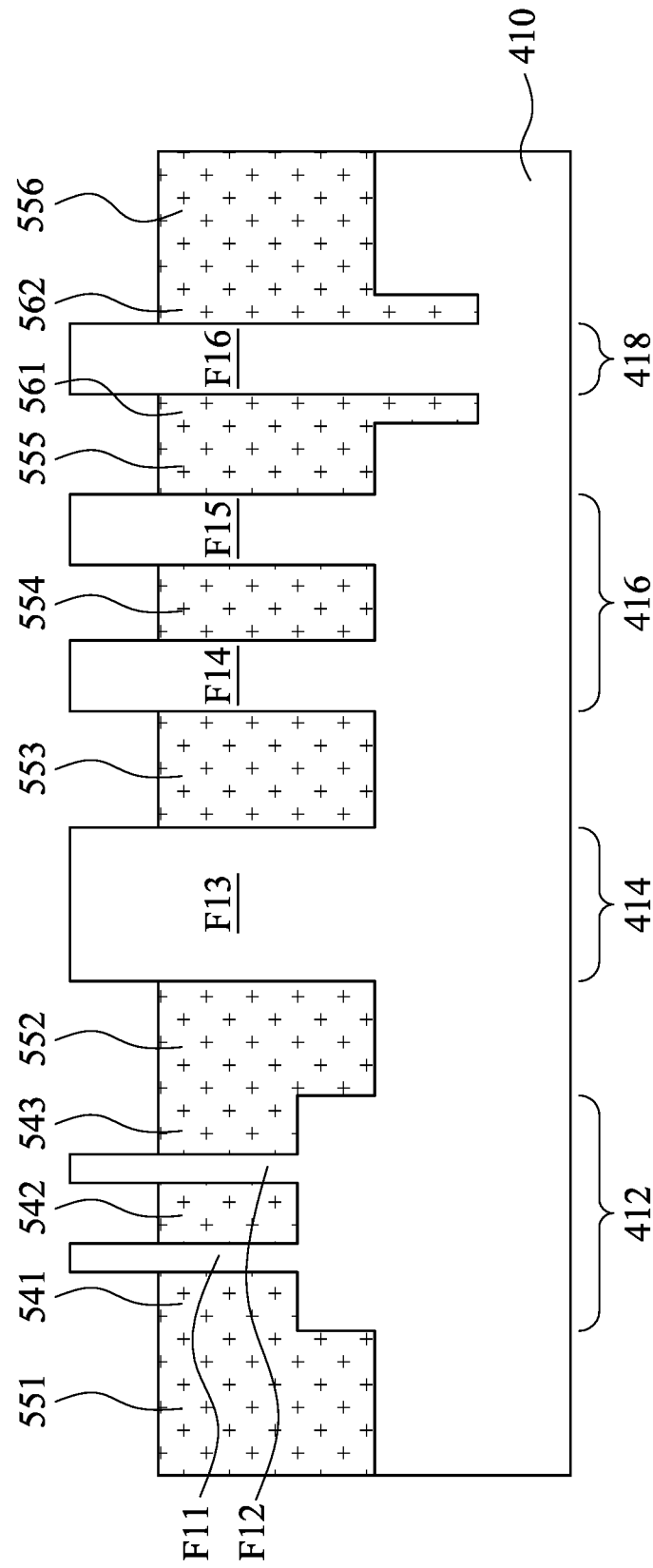

Reference is made to FIG. 24. Sacrificial layer 530 is formed on at least the semiconductor fins F11-F16. The sacrificial layer 530 may be used for implantation screening and reduction of the channeling effect during the subsequent implantation. The sacrificial layer 530 may be an oxide layer formed, for example, using CVD or PVD. Next, an ion implantation process is performed to impart impurities to the semiconductor fins F11-F16 and to form wells in the semiconductor substrate 410. The sacrificial layer 530 is then removed, and the STIs 501-503, 511-516 and 521-522 are then recessed through an etching process until upper portions of the semiconductor fins F11-F16 are exposed, resulting in recessed or lowered STIs 541-543, 551-556 and 561-562 on the semiconductor substrate 410, and the resulting structure is shown in FIG. 25. As illustrated, the first STIs 501-503 are recessed to form the recessed first STIs 541-543, the second STIs 511-516 are recessed to form the recessed second STIs 551-556, and the third STIs 521 and 522 are recessed to form the recessed third STIs 561 and 562. In some embodiments, the etching process may be a wet etching process, for example, by dipping the substrate 410 in hydrofluoric acid (HF). In alternative embodiments, the etching process may be a dry etching process, for example, the dry etching process may be performed using $CHF_3$ or $BF_3$ as etching gases. Since the STIs 541-543, 551-556 and 561-562 are recessed using the same etching process and at the same time, they can have top surfaces at substantially the same height at this stage. In some embodiments, a ratio of the thickness of second STI 555 to the thickness of the third STI 561 abutting the second STI 555 ranges from about 1/12 to about 1/24.

Figure 26:
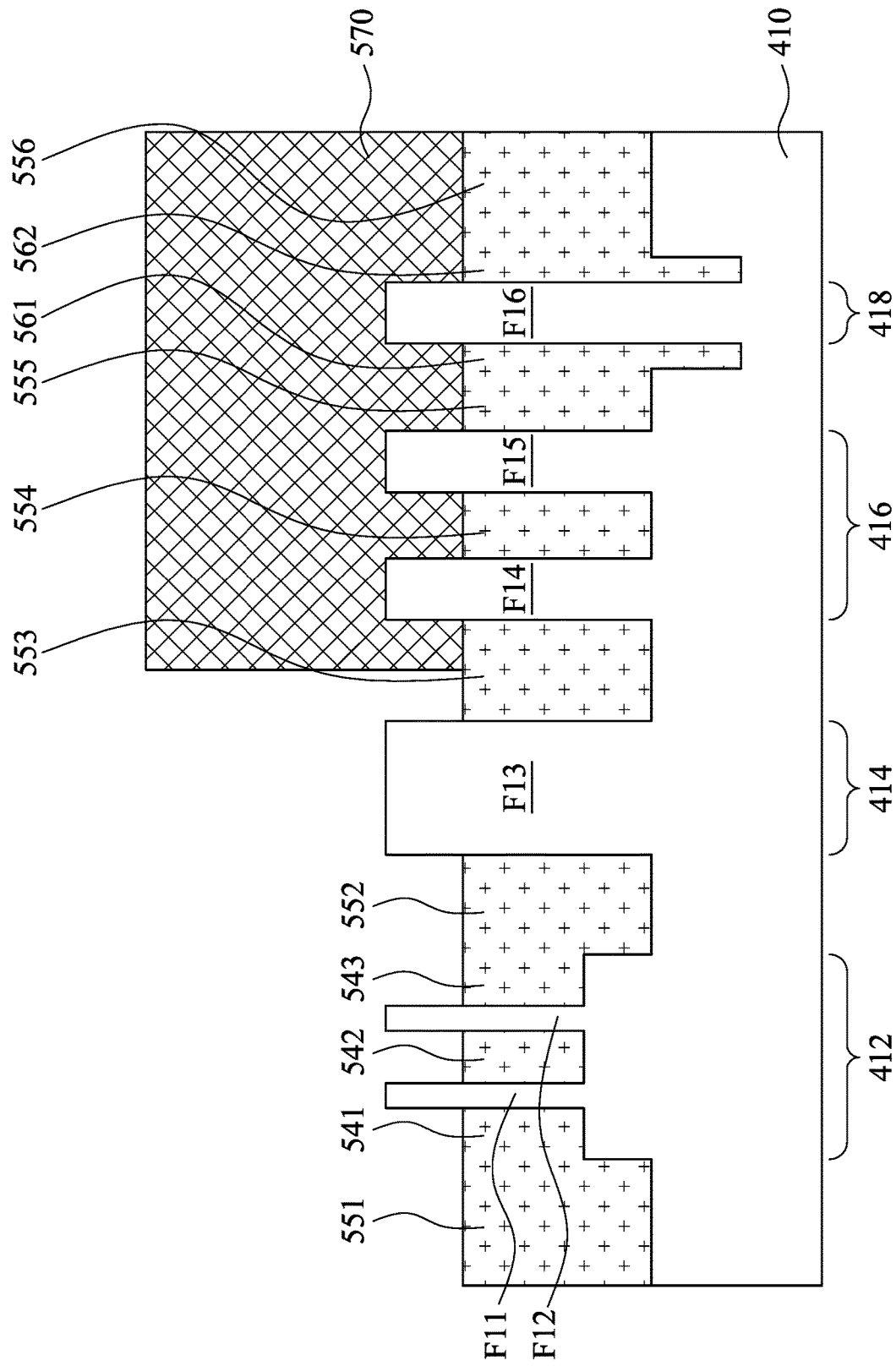

Reference is made to FIG. 26, mask 570 is applied to mask or cover a portion of the substrate 410, leaving another portion of the substrate 410 exposed. The mask 270 may be a photoresist. This photoresist is applied to an entirety of the substrate 410 and then patterned so that portions of the mask 570 over parts of the substrate 410 with recessed second STIs 554-556 and third STIs 561-562 remain. Recessed second STIs 551 and 552 and first STIs 541-543 are exposed by the mask 270. In some embodiments, a portion of the recessed second STI 553 is covered, and a portion of the recessed second STI 553 is exposed.

Figure 27:
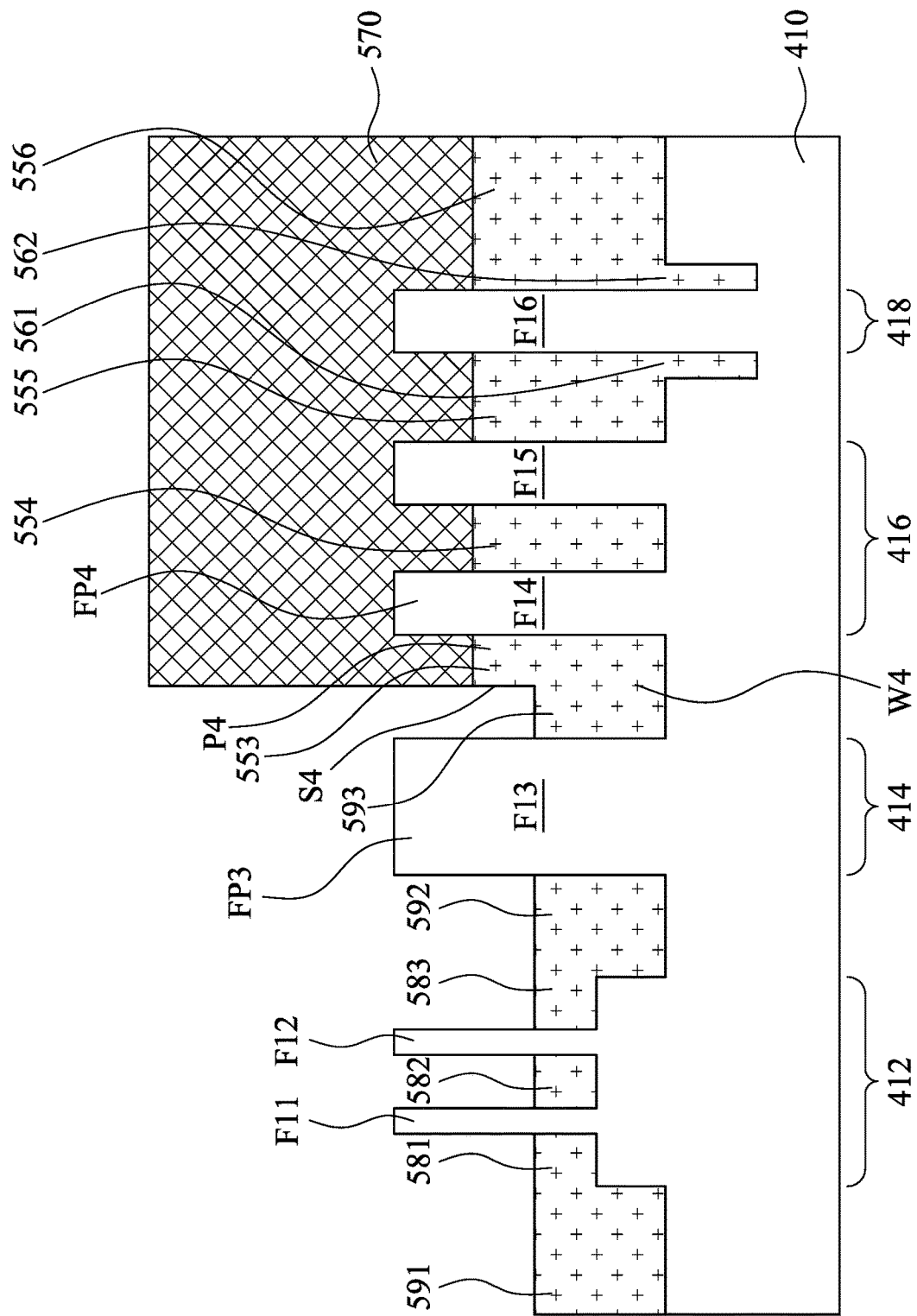

The exposed STIs are then recessed through an etching process, resulting in further recessed or lowered fourth STIs 581-583 and fifth STIs 591-593 on the semiconductor substrate 410, and the resulting structure is shown in FIG. 27. As illustrated, the recessed first STIs 541-543 are further recessed to form fourth STIs 581-583, and the recessed second STIs 551 and 552 are further recessed to form fifth STIs 591 and 592. An unmasked portion of the recessed second STI 553 is further recessed to form the fifth STI 593. In some embodiments, the etching process may be a wet etching process, for example, by dipping the substrate 410 in hydrofluoric acid (HF). In alternative embodiments, the etching process may be a dry etching process, for example, the dry etching process may be performed using $CHF_3$ or $BF_3$ as etching gases. Since the fourth and fifth STIs 581-583 and 591-593 are recessed using the same etching process and at the same time, they can have top surfaces at substantially the same height, and the top surfaces of the fourth and fifth STIs 581-583 and 591-593 may be located at the height lower than the top surfaces of the second and third STIs 553-556 and 561-562 due to the fact that the fourth and fifth STIs 581-583 and 591-593 undergo additional etching.

In some embodiments, a portion of the STI between the adjacent semiconductor fins F13 and F14 is recessed, and another portion of the STI is masked. Therefore, the resulting STIs 593 and 553 between the semiconductor fins F13 and F14 can have different thicknesses. In particular, the second STI 553 is thicker than the fifth STI 593. In some embodiments, a ratio of the thickness of fifth STI 593 to the thickness of the second STI 553 ranges from about 1/1.2 to about 1/1.6. For example, the top surface of the fifth STI 593 is located at the height lower than a height of the second STI 553. The second STI 553 and the fifth STI 593 are abutted, monolithically connected, immediately adjacent, or in contact with to each other, and materials other than the STIs 593 and 553 are absent between the STIs 593 and 553. For example, a semiconductor feature, a conductive feature or a combination thereof is absent between the STIs 593 and 553. This arrangement may be advantageous to reduce the distance between semiconductor devices on the adjacent device regions 414 and 416 using different STI thicknesses. For example, the device regions 414 and 416 respectively have semiconductor fins F13 and F14 thereon, and the semiconductor fins F13 and F14 are adjacent, which means that an additional semiconductor fin is absent between the semiconductor fins F13 and F14. The STI isolating the semiconductor fins F13 and F14 may include a second STI 553 abutting the semiconductor fin F14 and a fifth STI 593 abutting the semiconductor fin F13. The second STI 553 has a sidewall S4, and the fifth STI 593 abuts a lower region of the sidewall S4. Stated differently, the second STI 553 has a portion protruded from a top surface of the fifth STI 593. The abutted STIs 553 and 593 having different thicknesses may provide suitable isolations for the adjacent semiconductor fins F13 and F14, which are used to form semiconductor devices having different functions. Similarly, the fourth STI 583 and fifth STI 592 having different thicknesses may provide suitable isolations for the adjacent semiconductor fins F12 and F13. In some embodiments, a ratio of the thickness of fourth STI 583 to the thickness of the fifth STI 592 abutting the fourth STI 583 ranges from about 0.3 to about 0.8.

In some embodiments, a portion of the semiconductor fin F13 protrudes from the fifth STI 593 and can be referred to as a protrusion FP3, and a portion of the semiconductor fin F14 protrudes from the second STI 553 and can be referred to as a protrusion FP4. The protrusions FP3 and FP4 have different thicknesses due to the thickness difference between the STIs 593 and 553.

In some embodiments, the STI isolating the adjacent semiconductor fins F13 and F14 may include an STI W4 and a dielectric protrusion P4. The dielectric protrusion P4 protrudes from a top of the STI W4, and the dielectric protrusion P4 has a width less than a width of the STI W4. The dielectric protrusion P4 protrudes from the STI W4 in a direction farther away from the substrate 410. The dielectric protrusion P4 is closer to the semiconductor fin F14 than to the semiconductor fin F13. For example, the dielectric protrusion P4 abuts the semiconductor fin F14 and is spaced apart from the semiconductor fin F13. Stated differently, the isolation structure isolating the adjacent semiconductor fins F13 and F14 includes a first portion (i.e. STI 553) and a second portion (i.e. STI 593). The first portion is closer to the semiconductor fin F14 than the second portion, and the first portion is thicker than the second portion. For example, the isolation structure isolating two neighboring fins has a stepped top surface. Using this configuration, a portion of the STI adjacent to the semiconductor fin F14 has a thickness different from that adjacent to the semiconductor fin F13. This thickness difference may be advantageous to provide suitable isolations for the adjacent semiconductor fins F13 and F14.

In some embodiments, top surfaces of the STIs 593 and 561 are located at different heights, and bottom surfaces of the STIs 593 and 561 are located at different heights as well. Such differences may provide further different isolations suitable for the semiconductor fins F13 and F16. In some embodiments, a height difference between the top surfaces of the STIs 593 and 561 is different from that between the bottom surfaces of the STIs 593 and 561. Such a difference may provide further different isolation structures having different thicknesses suitable for the semiconductor fins F13 and F16.

Figure 28:
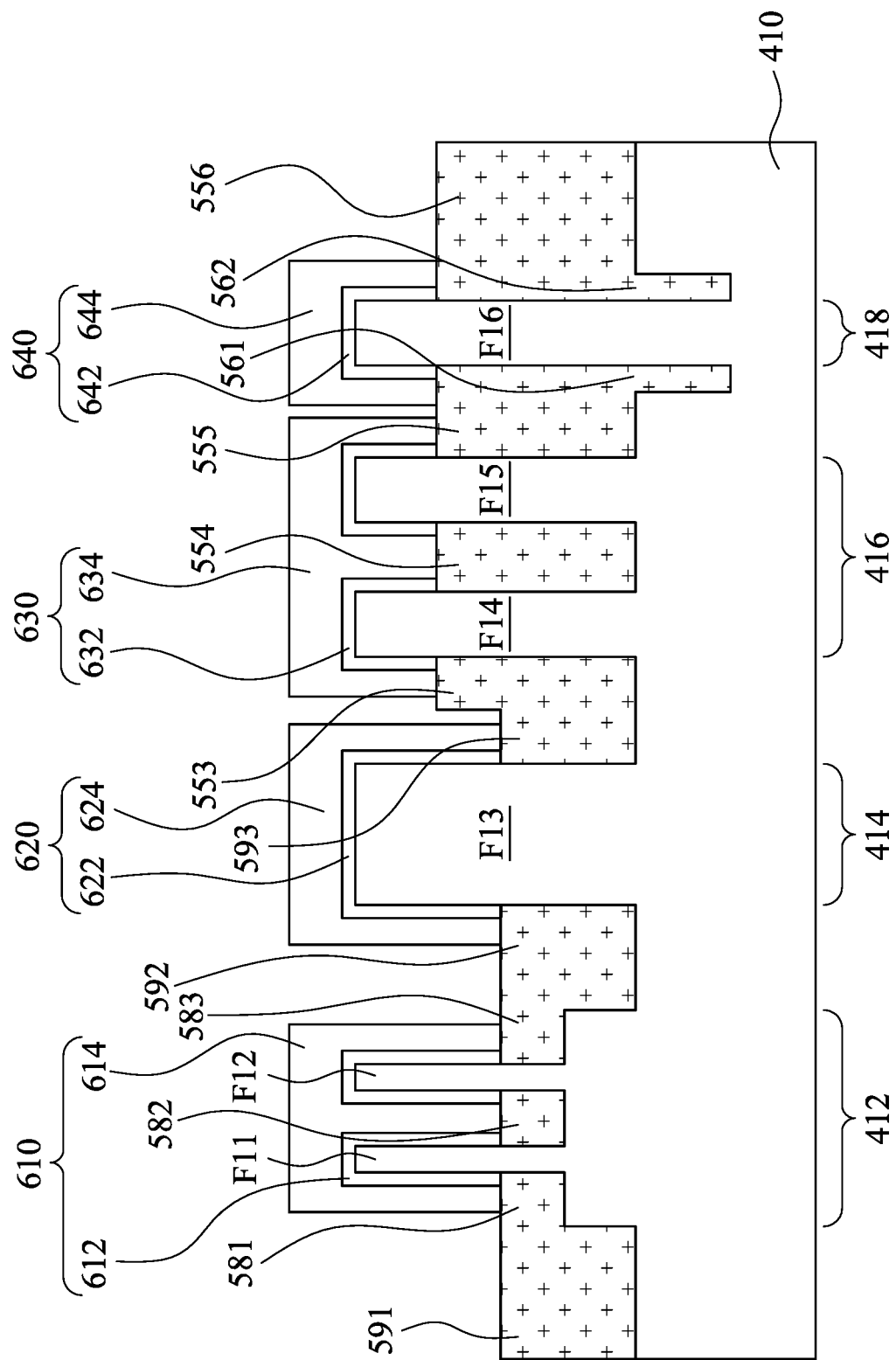

FIG. 28 illustrates formation of gate structures 610, 620, 630 and 640 in device regions 412, 414, 416 and 418, respectively. The gate structures 620 and 630 have bottoms at different heights due to that the STIs 593 and 553 respectively underlie the gate structures 630 and 630 having top surfaces at different heights. For example, the bottom surface of the gate structure 620 is lower than the bottom surface of the gate structure 630. Gate dielectric 612 of the gate structure 610 is formed to wrap the semiconductor fins F11 and F12 on the logic device region 412. Gate electrode 614 of the gate structure 610 is then formed on gate dielectric 612. Gate dielectric 622 of the gate structure 620 is formed to wrap the semiconductor fin F13 on the HV device region 414. Gate electrode 624 of the gate structure 620 is then formed on gate dielectric 622. Gate dielectric 632 of the gate structure 630 is formed to wrap the semiconductor fins F14 and F15 on the memory device region 416. Gate electrode 634 of the gate structure 630 is then formed on gate dielectric 632. Gate dielectric 642 of the gate structure 640 is formed to wrap the semiconductor fin F16 on the CMOS image sensor region 418. Gate electrode 644 of the gate structure 640 is then formed on gate dielectric 642. Gate dielectrics and electrodes may include suitable materials formed by suitable techniques as discussed previously. Source/drain regions for the semiconductor fins F11-F16 can be formed before or after the formation of the gate structures 610-640, for example, using a suitable technique, such as implant processes or combinations of epitaxy processes and implant processes. As a result, semiconductor devices can be formed on the device regions 412-418.

Some embodiments of the present disclosure may provide isolation structures having different thicknesses for different semiconductor devices. Such a thickness difference may thus be advantageous to provide various isolations suitable for different semiconductor devices. For example, isolation structure having suitable thickness for logic devices may improve their performance and reduce leakage currents, isolation structure having suitable thickness for CMOS image sensor may reduce dark currents and white pixels and may improve signal to noise ratio (SNR), and isolation structure having suitable thickness for memory devices may improve their data retention. Moreover, the isolation structures having different thicknesses are abutted and between semiconductor devices. This arrangement may be advantageous to reduce the distance between semiconductor devices using isolation structures with different thicknesses.

According to some embodiments, a structure includes a semiconductor substrate, a first fin, a second fin, a first isolation structure, and a second isolation structure. The semiconductor substrate has a memory device region and a logic core region. The first fin is in the memory device region of the semiconductor substrate. The second fin is in the logic core region of the semiconductor substrate. The first isolation structure is around the first fin. The second isolation structure is around the second fin, and a thickness of the first isolation structure is different from a thickness of the second isolation structure.

According to some embodiments, a structure includes a semiconductor substrate, a first fin, a second fin, a first isolation structure, and a second isolation structure. The semiconductor substrate has a logic core region and a complementary metal-oxide-semiconductor (CMOS) image sensor region. The first fin is in the logic core region of the semiconductor substrate. The second fin is in the CMOS image sensor region of the semiconductor substrate. The first isolation structure is around the first fin. The second isolation structure is around the second fin, and a thickness of the first isolation structure is different from a thickness of the second isolation structure.

According to some embodiments, a structure includes a semiconductor substrate, a first fin, a second fin, a first isolation structure, and a second isolation structure. The semiconductor substrate has a memory device region and a high voltage (HV) device region. The first fin is in the memory device region of the semiconductor substrate. The second fin is in the HV device region of the semiconductor substrate. The first isolation structure is around the first fin. The second isolation structure is around the second fin, and a thickness of the first isolation structure is different from a thickness of the second isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first trench in a semiconductor substrate;
   filling a mask in the first trench and over the semiconductor substrate;
   after filling the mask in the first trench, patterning the mask to form an opening in the mask;
   forming a second trench in the semiconductor substrate, wherein a depth of the second trench is different from a depth of the first trench;
   after forming the second trench in the semiconductor substrate, removing the mask; and
   filling a dielectric material in both the first and second trenches.

2. The method of claim 1, wherein forming the second trench in the semiconductor substrate is such that the second trench exposes a bottom portion of a sidewall of the mask.

3. The method of claim 1, wherein the depth of the first trench is greater than the depth of the second trench.

4. The method of claim 1, further comprising:
   forming a third trench in the semiconductor substrate after removing the mask and prior to filling the dielectric material in both the first and second trenches, wherein a depth of the third trench is different from the depth of the second trench.

5. The method of claim 4, wherein the depth of the second trench is greater than the depth of the third trench.

6. The method of claim 1, further comprising recessing a first portion of the dielectric material in the second trench with a first depth.

7. The method of claim 6, further comprising recessing a second portion of the dielectric material in the first trench with a second depth smaller than the first depth.

8. A method comprising:
   forming a first trench and a second trench in a semiconductor substrate, wherein the second trench is deeper than the first trench;
   filling a dielectric material in both the first and second trenches;
   forming a first mask over a first portion of the dielectric material in the second trench and exposing a second portion of the dielectric material in the first trench; and
   recessing the second portion of the dielectric material in the first trench by using the first mask as an etch mask.

9. The method of claim 8, further comprising performing a planarization process to the dielectric material to expose a top surface of the semiconductor substrate.

10. The method of claim 9, further comprising after performing the planarization process, forming a sacrificial layer over the dielectric material and the semiconductor substrate.

11. The method of claim 10, further comprising performing an ion implantation processing to impart impurities to the semiconductor substrate through the sacrificial layer.

12. The method of claim 10, further comprising removing the sacrificial layer prior to recessing the second portion of the dielectric material in the first trench.

13. The method of claim 8, further comprising:
   removing the first mask;
   forming a second mask over the recessed second portion of the dielectric material in the first trench and exposing the first portion of the dielectric material in the second trench; and
   recessing the first portion of the dielectric material in the second trench by using the second mask as an etch mask.

14. A method comprising:
   etching a semiconductor substrate to form a first portion of the semiconductor substrate protruding from a bottom portion of the semiconductor substrate and a second portion of the semiconductor substrate protruding from the bottom portion of the semiconductor substrate, wherein the first portion of the semiconductor substrate is in a logic core region of the semiconductor substrate and the second portion of the semiconductor substrate is in a memory device region of the semiconductor substrate, and the first portion of the semiconductor substrate is wider than the second portion of the semiconductor substrate;
   forming a mask over the semiconductor substrate and covering the first portion and the second portion of the semiconductor substrate;
   patterning the first portion of the semiconductor substrate by using the mask as an etch mask to form a semiconductor fin shorter and thinner than the second portion of the semiconductor substrate;
   removing the mask; and
   depositing a dielectric material to surround the semiconductor fin and the second portion of the semiconductor substrate.

15. The method of claim 14, further comprising etching a portion of the dielectric material in the logic core region, such that a top of the semiconductor fin protrudes from the dielectric material.

16. The method of claim 15, further comprising after etching the portion of the dielectric material, etching another portion of the dielectric material in the memory device region, such that a top of the second portion of the semiconductor substrate protrudes from the dielectric material.

17. The method of claim 16, wherein the top of the semiconductor fin protrudes from the dielectric material has a height greater than the top of the top of the second portion of the semiconductor substrate.

18. The method of claim 16, wherein a bottom of the second portion of the semiconductor substrate embedded in the dielectric material has a height greater than a bottom of the semiconductor fin.

19. The method of claim 14, wherein etching the semiconductor substrate further forms a third portion of the semiconductor substrate protruding from the bottom portion of the semiconductor substrate, the third portion of the semiconductor substrate is in a high-voltage device region of the semiconductor substrate and has a width greater than a width of the second portion of the semiconductor substrate.

20. The method of claim 19, wherein patterning the first portion of the semiconductor substrate is performed while the mask covering the third portion of the semiconductor substrate.

* * * * *